(12) United States Patent
Takemura et al.

(10) Patent No.: US 10,454,475 B2
(45) Date of Patent: Oct. 22, 2019

(54) SEMICONDUCTOR DEVICE

(71) Applicant: Semiconductor Energy Laboratory Co., Ltd., Atsugi-shi, Kanagawa-ken (JP)

(72) Inventors: Yasuhiko Takemura, Isehara (JP); Shunpei Yamazaki, Setagaya (JP)

(73) Assignee: Semiconductor Energy Laboratory Co., Ltd., Atsugi-shi, Kanagawa-ken (JP)

( * ) Notice: Subject to any disclaimer, the term of this patent is extended or adjusted under 35 U.S.C. 154(b) by 0 days.

(21) Appl. No.: 15/444,696

(22) Filed: Feb. 28, 2017

(65) Prior Publication Data

US 2017/0170828 A1 Jun. 15, 2017

Related U.S. Application Data

(60) Continuation of application No. 14/280,950, filed on May 19, 2014, now Pat. No. 9,614,097, which is a
(Continued)

(30) Foreign Application Priority Data

Jan. 20, 2010 (JP) ................................. 2010-009569

(51) Int. Cl.
*H03K 19/177* (2006.01)
*H03K 19/00* (2006.01)
(Continued)

(52) U.S. Cl.
CPC ..... *H03K 19/0013* (2013.01); *H01L 27/0629* (2013.01); *H01L 29/7869* (2013.01);
(Continued)

(58) Field of Classification Search
None
See application file for complete search history.

(56) References Cited

U.S. PATENT DOCUMENTS 4,799,193 A 1/1989 Horiguchi et al.
4,885,719 A 12/1989 Brahmbhatt
(Continued)

FOREIGN PATENT DOCUMENTS

CN 001622331 A 6/2005
EP 0416546 A 3/1991
(Continued)

OTHER PUBLICATIONS

European Search Report (Application No. 10843972.0) dated Sep. 24, 2013.
(Continued)

*Primary Examiner* — Crystal L Hammond
(74) *Attorney, Agent, or Firm* — Eric J. Robinson; Robinson Intellectual Property Law Office, P.C.

(57) ABSTRACT

It is an object to provide a semiconductor device in which power consumption can be reduced. It is another object to provide a highly reliable semiconductor device using a programming cell, such as a programmable logic device (PLD). In accordance with a change in a configuration of connections between basic blocks, power supply voltage furnishing to the basic blocks is changed. That is, when the structure of connections between the basic blocks is such that a basic block does not contribute to a circuit, the supply of the power supply voltage to this basic block is stopped. Further, the supply of the power supply voltage to the basic blocks is controlled using a programming cell formed using a field effect transistor whose channel formation region is
(Continued)

formed using an oxide semiconductor, the field effect transistor having extremely low off-state current or extremely low leakage current.

20 Claims, 17 Drawing Sheets

Related U.S. Application Data division of application No. 14/033,924, filed on Sep. 23, 2013, now Pat. No. 8,760,931, which is a continuation of application No. 13/005,557, filed on Jan. 13, 2011, now Pat. No. 8,547,753.

(51) Int. Cl.
| | |
|---|---|
| H01L 27/06 | (2006.01) |
| H01L 29/786 | (2006.01) |
| H03K 17/16 | (2006.01) |
| H03K 19/173 | (2006.01) |

(52) U.S. Cl.
CPC ......... *H03K 17/161* (2013.01); *H03K 19/173* (2013.01); *H03K 19/1776* (2013.01); *H03K 19/17724* (2013.01); *H03K 19/17736* (2013.01); *H03K 19/17772* (2013.01); *H03K 19/17784* (2013.01); *H01L 2924/0002* (2013.01)

(56) References Cited

U.S. PATENT DOCUMENTS

| | | | |
|---|---|---|---|
| 4,896,296 | A | 1/1990 | Turner et al. |
| 5,214,327 | A | 5/1993 | Saeki et al. |
| 5,594,698 | A | 1/1997 | Freeman |
| 5,731,856 | A | 3/1998 | Kim et al. |
| 5,744,864 | A | 4/1998 | Cillessen et al. |
| 5,789,942 | A | 8/1998 | Mizuno |
| 6,057,707 | A | 5/2000 | Schleicher et al. |
| 6,097,212 | A | 8/2000 | Agrawal et al. |
| 6,127,702 | A | 10/2000 | Yamazaki et al. |
| 6,130,553 | A | 10/2000 | Nakaya |
| 6,172,521 | B1 | 1/2001 | Motomura |
| 6,294,274 | B1 | 9/2001 | Kawazoe et al. |
| 6,351,076 | B1 | 2/2002 | Wang et al. |
| 6,359,320 | B1 | 3/2002 | Yamazaki et al. |
| 6,363,004 | B1 | 3/2002 | Kang et al. |
| 6,384,628 | B1 | 5/2002 | Lacey et al. |
| 6,563,174 | B2 | 5/2003 | Kawasaki et al. |
| 6,727,522 | B1 | 4/2004 | Kawasaki et al. |
| 6,756,632 | B1 | 6/2004 | Chen et al. |
| 6,809,425 | B1 | 10/2004 | Chen et al. |
| 6,834,009 | B1 | 12/2004 | Yue et al. |
| 6,924,663 | B2 | 8/2005 | Masui et al. |
| 6,940,307 | B1 | 9/2005 | Liu et al. |
| 7,049,190 | B2 | 5/2006 | Takeda et al. |
| 7,061,014 | B2 | 6/2006 | Hosono et al. |
| 7,064,346 | B2 | 6/2006 | Kawasaki et al. |
| 7,105,868 | B2 | 9/2006 | Nause et al. |
| 7,109,748 | B1 | 9/2006 | Liu et al. |
| 7,211,825 | B2 | 5/2007 | Shih et al. |
| 7,221,580 | B1 | 5/2007 | Penchuk |
| 7,282,782 | B2 | 10/2007 | Hoffman et al. |
| 7,297,977 | B2 | 11/2007 | Hoffman et al. |
| 7,323,356 | B2 | 1/2008 | Hosono et al. |
| 7,385,224 | B2 | 6/2008 | Ishii et al. |
| 7,402,506 | B2 | 7/2008 | Levy et al. |
| 7,411,209 | B2 | 8/2008 | Endo et al. |
| 7,453,065 | B2 | 11/2008 | Saito et al. |
| 7,453,087 | B2 | 11/2008 | Iwasaki |
| 7,462,862 | B2 | 12/2008 | Hoffman et al. |
| 7,468,304 | B2 | 12/2008 | Kaji et al. |
| 7,501,293 | B2 | 3/2009 | Ito et al. |
| 7,551,493 | B2 | 6/2009 | Kato et al. |
| 7,579,864 | B2 | 8/2009 | Ichinomiya |
| 7,620,926 | B1 | 11/2009 | Tuan |
| 7,674,650 | B2 | 3/2010 | Akimoto et al. |
| 7,732,819 | B2 | 6/2010 | Akimoto et al. |
| 7,750,671 | B2 | 7/2010 | Kang |
| 7,759,969 | B2 | 7/2010 | Maduràwe |
| 7,791,074 | B2 | 9/2010 | Iwasaki |
| 7,816,947 | B1 | 10/2010 | Wang |
| 7,863,611 | B2 | 1/2011 | Abe et al. |
| 7,863,930 | B2 | 1/2011 | Nishioka |
| 8,203,146 | B2 | 6/2012 | Abe et al. |
| 8,304,298 | B2 | 11/2012 | Ofuji et al. |
| 8,547,753 | B2 | 10/2013 | Takemura et al. |
| 8,599,111 | B2 | 12/2013 | Abe et al. |
| 8,629,817 | B2 | 1/2014 | Abe et al. |
| 8,654,114 | B2 | 2/2014 | Shimizu et al. |
| 8,681,077 | B2 | 3/2014 | Kimura |
| 8,760,931 | B2 | 6/2014 | Takemura et al. |
| 2001/0046027 | A1 | 11/2001 | Tai et al. |
| 2002/0015326 | A1 | 2/2002 | Rolandi et al. |
| 2002/0056838 | A1 | 5/2002 | Ogawa |
| 2002/0132454 | A1 | 9/2002 | Ohtsu et al. |
| 2002/0145907 | A1 | 10/2002 | Byeon et al. |
| 2003/0122578 | A1* | 7/2003 | Masui ............... G06F 21/76 326/39 |
| 2003/0189401 | A1 | 10/2003 | Kido et al. |
| 2003/0218222 | A1 | 11/2003 | Wager, III et al. |
| 2004/0038446 | A1 | 2/2004 | Takeda et al. |
| 2004/0127038 | A1 | 7/2004 | Carcia et al. |
| 2005/0017302 | A1 | 1/2005 | Hoffman |
| 2005/0114722 | A1 | 5/2005 | Tanaka et al. |
| 2005/0199959 | A1 | 9/2005 | Chiang et al. |
| 2006/0035452 | A1 | 2/2006 | Carcia et al. |
| 2006/0043377 | A1 | 3/2006 | Hoffman et al. |
| 2006/0091793 | A1 | 5/2006 | Baude et al. |
| 2006/0108529 | A1 | 5/2006 | Saito et al. |
| 2006/0108636 | A1 | 5/2006 | Sano et al. |
| 2006/0110867 | A1 | 5/2006 | Yabuta et al. |
| 2006/0113536 | A1 | 6/2006 | Kumomi et al. |
| 2006/0113539 | A1 | 6/2006 | Sano et al. |
| 2006/0113549 | A1 | 6/2006 | Den et al. |
| 2006/0113565 | A1 | 6/2006 | Abe et al. |
| 2006/0169973 | A1 | 8/2006 | Isa et al. |
| 2006/0170111 | A1 | 8/2006 | Isa et al. |
| 2006/0197092 | A1 | 9/2006 | Hoffman et al. |
| 2006/0208977 | A1 | 9/2006 | Kimura |
| 2006/0228974 | A1 | 10/2006 | Thelss et al. |
| 2006/0231882 | A1 | 10/2006 | Kim et al. |
| 2006/0238135 | A1 | 10/2006 | Kimura |
| 2006/0244107 | A1 | 11/2006 | Sugihara et al. |
| 2006/0284171 | A1 | 12/2006 | Levy et al. |
| 2006/0284172 | A1 | 12/2006 | Ishii |
| 2006/0292777 | A1 | 12/2006 | Dunbar |
| 2007/0024187 | A1 | 2/2007 | Shin et al. |
| 2007/0046191 | A1 | 3/2007 | Saito |
| 2007/0052025 | A1 | 3/2007 | Yabuta |
| 2007/0054507 | A1 | 3/2007 | Kaji et al. |
| 2007/0090365 | A1 | 4/2007 | Hayashi et al. |
| 2007/0108446 | A1 | 5/2007 | Akimoto |
| 2007/0152217 | A1 | 7/2007 | Lai et al. |
| 2007/0172591 | A1 | 7/2007 | Seo et al. |
| 2007/0187678 | A1 | 8/2007 | Hirao et al. |
| 2007/0187760 | A1 | 8/2007 | Furuta et al. |
| 2007/0194379 | A1 | 8/2007 | Hosono et al. |
| 2007/0210826 | A1 | 9/2007 | Madurawe |
| 2007/0236985 | A1* | 10/2007 | Edahiro ............... G11C 8/10 365/154 |
| 2007/0252928 | A1 | 11/2007 | Ito et al. |
| 2007/0272922 | A1 | 11/2007 | Kim et al. |
| 2007/0285984 | A1 | 12/2007 | Kato et al. |
| 2007/0287296 | A1 | 12/2007 | Chang |
| 2008/0006877 | A1 | 1/2008 | Mardilovich et al. |
| 2008/0038882 | A1 | 2/2008 | Takechi et al. |
| 2008/0038929 | A1 | 2/2008 | Chang |
| 2008/0050595 | A1 | 2/2008 | Nakagawara et al. |
| 2008/0067508 | A1 | 3/2008 | Endo et al. |
| 2008/0073653 | A1 | 3/2008 | Iwasaki |
| 2008/0083950 | A1 | 4/2008 | Pan et al. |
| 2008/0106191 | A1 | 5/2008 | Kawase |

(56) References Cited

U.S. PATENT DOCUMENTS

| | | |
|---|---|---|
| 2008/0128689 A1 | 6/2008 | Lee et al. |
| 2008/0129195 A1 | 6/2008 | Ishizaki et al. |
| 2008/0166834 A1 | 7/2008 | Kim et al. |
| 2008/0169836 A1 | 7/2008 | Rahim et al. |
| 2008/0182358 A1 | 7/2008 | Cowdery-Corvan et al. |
| 2008/0224133 A1 | 9/2008 | Park et al. |
| 2008/0254569 A1 | 10/2008 | Hoffman et al. |
| 2008/0258139 A1 | 10/2008 | Ito et al. |
| 2008/0258140 A1 | 10/2008 | Lee et al. |
| 2008/0258141 A1 | 10/2008 | Park et al. |
| 2008/0258143 A1 | 10/2008 | Kim et al. |
| 2008/0291350 A1* | 11/2008 | Hayashi .............. H01L 27/1225 349/47 |
| 2008/0296568 A1 | 12/2008 | Ryu et al. |
| 2008/0308805 A1 | 12/2008 | Akimoto et al. |
| 2009/0045397 A1 | 2/2009 | Iwasaki |
| 2009/0068773 A1 | 3/2009 | Lai et al. |
| 2009/0073325 A1 | 3/2009 | Kuwabara et al. |
| 2009/0114910 A1 | 5/2009 | Chang |
| 2009/0115452 A1 | 5/2009 | Ichinomiya |
| 2009/0134399 A1 | 5/2009 | Sakakura et al. |
| 2009/0152506 A1 | 6/2009 | Umeda et al. |
| 2009/0152541 A1 | 6/2009 | Maekawa et al. |
| 2009/0167352 A1 | 7/2009 | Norman |
| 2009/0278122 A1 | 11/2009 | Hosono et al. |
| 2009/0280600 A1 | 11/2009 | Hosono et al. |
| 2010/0038625 A1 | 2/2010 | Bertin |
| 2010/0065844 A1 | 3/2010 | Tokunaga |
| 2010/0084648 A1 | 4/2010 | Watanabe |
| 2010/0092800 A1 | 4/2010 | Itagaki et al. |
| 2010/0109002 A1 | 5/2010 | Itagaki et al. |
| 2010/0148171 A1 | 6/2010 | Hayashi et al. |
| 2010/0148820 A1 | 6/2010 | Nishioka |
| 2010/0276689 A1 | 11/2010 | Iwasaki |
| 2010/0279462 A1 | 11/2010 | Iwasaki |
| 2011/0001747 A1 | 1/2011 | Shimizu et al. |
| 2011/0065269 A1 | 3/2011 | Hayashi et al. |
| 2011/0089417 A1 | 4/2011 | Yamazaki et al. |
| 2011/0089975 A1 | 4/2011 | Yamazaki et al. |
| 2011/0101351 A1 | 5/2011 | Yamazaki |
| 2014/0125712 A1 | 5/2014 | Shimizu et al. |

FOREIGN PATENT DOCUMENTS

| | | |
|---|---|---|
| EP | 1737044 A | 12/2006 |
| EP | 1953916 A | 8/2008 |
| EP | 2226847 A | 9/2010 |
| EP | 2526622 A | 11/2012 |
| EP | 2526622 B | 9/2015 |
| JP | 60-198851 A | 10/1985 |
| JP | 63-151115 A | 6/1988 |
| JP | 63-210022 A | 8/1988 |
| JP | 63-210023 A | 8/1988 |
| JP | 63-210024 A | 8/1988 |
| JP | 63-215519 A | 9/1988 |
| JP | 63-239117 A | 10/1988 |
| JP | 63-265818 A | 11/1988 |
| JP | 01-130390 A | 5/1989 |
| JP | 02-291720 A | 12/1990 |
| JP | 04-278720 A | 10/1992 |
| JP | 05-251705 A | 9/1993 |
| JP | 08-264794 A | 10/1996 |
| JP | 09-074351 A | 3/1997 |
| JP | 11-505377 | 5/1999 |
| JP | 2000-044236 A | 2/2000 |
| JP | 2000-150900 A | 5/2000 |
| JP | 2002-076356 A | 3/2002 |
| JP | 2002-289859 A | 10/2002 |
| JP | 2003-086000 A | 3/2003 |
| JP | 2003-086808 A | 3/2003 |
| JP | 2004-103957 A | 4/2004 |
| JP | 2004-273614 A | 9/2004 |
| JP | 2004-273732 A | 9/2004 |
| JP | 2005-005611 A | 1/2005 |
| JP | 2006-165532 A | 6/2006 |
| JP | 2006-237189 A | 9/2006 |
| JP | 2006-293344 A | 10/2006 |
| JP | 2006-313999 A | 11/2006 |
| JP | 2007-096055 A | 4/2007 |
| JP | 2007-103918 A | 4/2007 |
| JP | 2007-123861 A | 5/2007 |
| JP | 2007-272224 A | 10/2007 |
| JP | 2008-098447 A | 4/2008 |
| JP | 2008-164794 A | 7/2008 |
| JP | 2008-216529 A | 9/2008 |
| JP | 2008-235704 A | 10/2008 |
| JP | 2008-281988 A | 11/2008 |
| JP | 2009-042664 A | 2/2009 |
| JP | 2009-099847 A | 5/2009 |
| JP | 2009-135350 A | 6/2009 |
| JP | 5660902 | 1/2015 |
| JP | 5855215 | 2/2016 |
| KR | 1994-0007003 | 8/1994 |
| KR | 10-0221757 | 9/1999 |
| TW | 393605 | 6/2000 |
| TW | 20090822 | 2/2009 |
| WO | WO-1994/022142 | 9/1994 |
| WO | WO-2004/114391 | 12/2004 |
| WO | WO-2007/029844 | 3/2007 |
| WO | WO-2007/060868 | 5/2007 |
| WO | WO-2007/105778 | 9/2007 |
| WO | WO-2008/126879 | 10/2008 |
| WO | WO-2008/143304 | 11/2008 |
| WO | WO-2009/022563 | 2/2009 |
| WO | WO-2009/034953 | 3/2009 |
| WO | WO-2009/063584 | 5/2009 |
| WO | WO-2011/089808 | 7/2011 |

OTHER PUBLICATIONS

Choi.D et al., "New Non-Volatile Memory Structures for FPGA Architectures", IEEE Transactions on Very Large Scale Integration (VLSI) Systems, Jul. 1, 2008, vol. 16, No. 7, pp. 874-881, IEEE.

International Search Report (Application No. PCT/JP2010/072839) dated Feb. 1, 2011.

Written Opinion (Application No. PCT/JP2010/072839) dated Feb. 1, 2011.

Fortunato.E et al., "Wide-Bandgap High-Mobility ZnO Thin-Film Transistors Produced at Room Temperature", Appl. Phys. Lett. (Applied Physics Letters), Sep. 27, 2004, vol. 85, No. 13, pp. 2541-2543.

Dembo.H et al., "RFCPUS on Glass and Plastic Substrates Fabricated by TFT Transfer Technology", IEDM 05: Technical Digest of International Electron Devices Meeting, Dec. 5, 2005, pp. 1067-1069.

Ikeda.T et al., "Full-Functional System Liquid Crystal Display Using CG-Silicon Technology", SID Digest '04 : SID International Symposium Digest of Technical Papers, 2004, vol. 35, pp. 860-863.

Nomura.K et al., "Room-Temperature Fabrication of Transparent Flexible Thin-Film Transistors Using Amorphous Oxide Semiconductors", Nature, Nov. 25, 2004, vol. 432, pp. 488-492.

Park.J et al., "Improvements in the Device Characteristics of Amorphous Indium Gallium Zinc Oxide Thin-Film Transistors by Ar Plasma Treatment", Appl. Phys. Lett. (Applied Physics Letters), Jun. 26, 2007, vol. 90, No. 26, pp. 262106-1-262106-3.

Takahashi.M et al., "Theoretical Analysis of IGZO Transparent Amorphous Oxide Semiconductor", IDW '08 : Proceedings of the 15th International Display Workshops, Dec. 3, 2008, pp. 1637-1640.

Hayashi.R et al., "42.1: Invited Paper: Improved Amorphous In—Ga—Zn—O TFTs", SID Digest '08 : SID International Symposium Digest of Technical Papers, May 20, 2008, vol. 39, pp. 621-624.

Prins.M et al., "A Ferroelectric Transparent Thin-Film Transistor", Appl. Phys. Lett. (Applied Physics Letters), Jun. 17, 1996, vol. 68, No. 25, pp. 3650-3652.

Nakamura.M et al., "The phase relations in the In2O3—Ga2ZnO4—ZnO system at 1350° C.", Journal of Solid State Chemistry, Aug. 1, 1991, vol. 93, No. 2, pp. 298-315.

Kimizuka.N et al., "Syntheses and Single-Crystal Data of Homologous Compounds, In2O3(ZnO)m (m=3, 4, and 5), InGaO3(ZnO)3,

(56) References Cited

OTHER PUBLICATIONS and Ga2O3(ZnO)m (m=7, 8, 9, and 16) in the In2O3—ZnGa2O4—ZnO System", Journal of Solid State Chemistry, Apr. 1, 1995, vol. 116, No. 1, pp. 170-178.

Nomura.K et al., "Thin-Film Transistor Fabricated in Single-Crystalline Transparent Oxide Semiconductor", Science, May 23, 2003, vol. 300, No. 5623, pp. 1269-1272.

Masuda.S et al., "Transparent thin film transistors using ZnO as an active channel layer and their electrical properties", J. Appl. Phys. (Journal of Applied Physics), Feb. 1, 2003, vol. 93, No. 3, pp. 1624-1630.

Asakuma.N et al., "Crystallization and Reduction of Sol-Gel-Derived Zinc Oxide Films by Irradiation With Ultraviolet Lamp", Journal of Sol-Gel Science and Technology, 2003, vol. 26, pp. 181-184.

Osada.T et al., "15.2: Development of Driver-Integrated Panel using Amorphous In—Ga—Zn-Oxide TFT", SID Digest '09 : SID International Symposium Digest of Technical Papers, May 31, 2009, vol. 40, pp. 184-187.

Nomura.K et al., "Carrier transport in transparent oxide semiconductor with intrinsic structural randomness probed using single-crystalline InGaO3(ZnO)5 films", Appl. Phys. Lett. (Applied Physics Letters), Sep. 13, 2004, vol. 85, No. 11, pp. 1993-1995.

Li.C et al., "Modulated Structures of Homologous Compounds InMO3(ZnO)m (M=In,Ga; m=Integer) Described by Four-Dimensional Superspace Group", Journal of Solid State Chemistry, 1998, vol. 139, pp. 347-355.

Son.K et al., "42.4L: Late-News Paper: 4 Inch QVGA AMOLED Driven by the Threshold Voltage Controlled Amorphous GIZO (Ga2O3—In2O3—ZnO) TFT", SID Digest '08 : SID International Symposium Digest of Technical Papers, May 20, 2008, vol. 39, pp. 633-636.

Lee.J et al., "World's Largest (15-Inch) XGA AMLCD Panel Using IGZO Oxide TFT", SID Digest '08 : SID International Symposium Digest of Technical Papers, May 20, 2008, vol. 39, pp. 625-628.

Nowatari.H et al., "60.2: Intermediate Connector With Suppressed Voltage Loss for White Tandem OLEDs", SID Digest '09 : SID International Symposium Digest of Technical Papers, May 31, 2009, vol. 40, pp. 899-902.

Kanno.H et al., "White Stacked Electrophosphorecent Organic Light-Emitting Devices Employing MoO3 as a Charge-Generation Layer", Adv. Mater. (Advanced Materials), 2006, vol. 18, No. 3, pp. 339-342.

Tsuda.K et al., "Ultra Low Power Consumption Technologies for Mobile TFT-LCDs", IDW '02 : Proceedings of the 9th International Display Workshops, Dec. 4, 2002, pp. 295-298.

Van de Walle.C, "Hydrogen as a Cause of Doping in Zinc Oxide", Phys. Rev. Lett. (Physical Review Letters), Jul. 31, 2000, vol. 85, No. 5, pp. 1012-1015.

Fung.T et al., "2-D Numerical Simulation of High Performance Amorphous In—Ga—Zn—O TFTs for Flat Panel Displays", AM-FPD '08 Digest of Technical Papers, Jul. 2, 2008, pp. 251-252, The Japan Society of Applied Physics.

Jeong.J et al., "3.1: Distinguished Paper: 12.1-Inch WXGA AMOLED Display Driven by Indium-Gallium-Zinc Oxide TFTs Array", SID Digest '08 : SID International Symposium Digest of Technical Papers, May 20, 2008, vol. 39, No. 1, pp. 1-4.

Park.J et al., "High performance amorphous oxide thin film transistors with self-aligned top-gate structure", IEDM 09: Technical Digest of International Electron Devices Meeting, Dec. 7, 2009, pp. 191-194.

Kurokawa.Y et al., "UHF RFCPUS on Flexible and Glass Substrates for Secure RFID Systems", Journal of Solid-State Circuits, 2008, vol. 43, No. 1, pp. 292-299.

Ohara.H et al., "Amorphous In—Ga—Zn-Oxide TFTs with Suppressed Variation for 4.0 inch QVGA AMOLED Display", AM-FPD '09 Digest of Technical Papers, Jul. 1, 2009, pp. 227-230, The Japan Society of Applied Physics.

Coates.D et al., "Optical Studies of the Amorphous Liquid-Cholesteric Liquid Crystal Transition:The "Blue Phase"", Physics Letters, Sep. 10, 1973, vol. 45A, No. 2, pp. 115-116.

Cho.D et al., "21.2:Al and Sn-Doped Zinc Indium Oxide Thin Film Transistors for AMOLED Back-Plane", SID Digest '09 : SID International Symposium Digest of Technical Papers, May 31, 2009, pp. 280-283.

Lee.M et al., "15.4:Excellent Performance of Indium-Oxide-Based Thin-Film Transistors by DC Sputtering", SID Digest '09 : SID International Symposium Digest of Technical Papers, May 31, 2009, pp. 191-193.

Jin.D et al., "65.2:Distinguished Paper:World-Largest (6.5") Flexible Full Color Top Emission AMOLED Display on Plastic Film and Its Bending Properties", SID Digest '09 : SID International Symposium Digest of Technical Papers, May 31, 2009, pp. 983-985.

Sakata.J et al., "Development of 4.0-In. AMOLED Display With Driver Circuit Using Amorphous In—Ga—Zn-Oxide TFTs", IDW '09 : Proceedings of the 16th International Display Workshops, 2009, pp. 689-692.

Park.J et al., "Amorphous Indium-Gallium-Zinc Oxide TFs and Their Application for Large Size AMOLED", AM-FPD '08 Digest of Technical Papers, Jul. 2, 2008, pp. 275-278.

Park.S et al., "Challenge to Future Displays: Transparent AM-OLED Driven by Peald Grown ZnO TFT", IMID '07 Digest, 2007, pp. 1249-1252.

Godo.H et al., "Temperature Dependence of Characteristics and Electronic Structure for Amorphous In—Ga—Zn-Oxide TFT", AM-FPD '09 Digest of Technical Papers, Jul. 1, 2009, pp. 41-44.

Osada.T et al., "Development of Driver-Integrated Panel Using Amorphous In—Ga—Zn-Oxide TFT", AM-FPD '09 Digest of Technical Papers, Jul. 1, 2009, pp. 33-36.

Hirao.T et al., "Novel Top-Gate Zinc Oxide Thin-Film Transistors (ZnO TFTs) for AMLCDS", J. Soc. Inf. Display (Journal of the Society for Information Display), 2007, vol. 15, No. 1, pp. 17-22.

Hosono.H, "68.3:Invited Paper:Transparent Amorphous Oxide Semiconductors for High Performance TFT", SID Digest '07 : SID International Symposium Digest of Technical Papers, 2007, vol. 38, pp. 1830-1833.

Godo.H et al., "P-9:Numerical Analysis on Temperature Dependence of Characteristics of Amorphous In—Ga—Zn-Oxide TFT", SID Digest '09 : SID International Symposium Digest of Technical Papers, May 31, 2009, pp. 1110-1112.

Ohara.H et al., "21.3:4.0 In, QVGA AMOLED Display Using In—Ga—Zn-Oxide TFTs With a Novel Passivation Layer", SID Digest '09 : SID International Symposium Digest of Technical Papers, May 31, 2009, pp. 284-287.

Miyasaka.M, "SUFTLA Flexible Microelectronics on Their Way to Business", SID Digest '07 : SID International Symposium Digest of Technical Papers, 2007, vol. 38, pp. 1673-1676.

Chern.H et al., "An Analytical Model for the Above-Threshold Characteristics of Polysilicon Thin-Film Transistors", IEEE Transactions on Electron Devices, Jul. 1, 1995, vol. 42, No. 7, pp. 1240-1246.

Kikuchi.H et al., "39.1:Invited Paper:Optically Isotropic Nano-Structured Liquid Crystal Composites for Display Applications", SID Digest '09 : SID International Symposium Digest of Technical Papers, May 31, 2009, pp. 578-581.

Asaoka.Y et al., "29.1:Polarizer-Free Reflective LCD Combined With Ultra Low-Power Driving Technology", SID International Symposium Digest of Technical Papers, May 31, 2009, pp. 395-398.

Lee.H et al., "Current Status of, Challenges to, and Perspective View of AM-OLED", IDW '06 : Proceedings of the 13th International Display Workshops, Dec. 7, 2006, pp. 663-666. Eng,.

Kikuchi.H et al., "62.2:Invited Paper:Fast Electro-Optical Switching in Polymer-Stabilized Liquid Crystalline Blue Phases for Display Application", SID International Symposium Digest of Technical Papers, 2007, vol. 38, pp. 1737-1740.

Nakamura.M, "Synthesis of Homologous Compound with New Long-Period Structure", Nirim Newsletter, Mar. 1, 1995, vol. 150, pp. 1-4.

Kikuchi.H et al., "Polymer-Stabilized Liquid Crystal Blue Phases", Nature Materials, Sep. 2, 2002, vol. 1, pp. 64-68.

(56) References Cited

OTHER PUBLICATIONS

Kimizuka.N et al., "Spinel,YbFe2O4, and Yb2Fe3O7 Types of Structures for Compounds in the In2O3 and Sc2O3—A2O3—BO Systems [A; Fe, Ga, or Al; B: Mg, Mn, Fe, Ni, Cu,or Zn] at Temperatures Over 1000° C.", Journal of Solid State Chemistry, 1985, vol. 60, pp. 382-384.

Kitzerow.H et al., "Observation of Blue Phases in Chiral Networks", Liquid Crystals, 1993, vol. 14, No. 3, pp. 911-916.

Costello.M et al., "Electron Microscopy of a Cholesteric Liquid Crystal and Its Blue Phase", Phys. Rev. A (Physical Review. A), May 1, 1984, vol. 29, No. 5, pp. 2957-2959.

Meiboom.S et al., "Theory of the Blue Phase of Cholesteric Liquid Crystals", Phys. Rev. Lett. (Physical Review Letters), May 4, 1981, vol. 46, No. 18, pp. 1216-1219.

Park.Sang-Hee et al., "42.3: Transparent ZnO Thin Film Transistor for the Application of High Aperture Ratio Bottom Emission AM-OLED Display", SID Digest '08 : SID International Symposium Digest of Technical Papers, May 20, 2008, vol. 39, pp. 629-632.

Orita.M et al., "Mechanism of Electrical Conductivity of Transparent InGaZnO4", Phys. Rev. B (Physical Review. B), Jan. 15, 2000, vol. 61, No. 3, pp. 1811-1816.

Nomura.K et at, "Amorphous Oxide Semiconductors for High-Performance Flexible Thin-Film Transistors", JPN. J. Appl. Phys. (Japanese Journal of Applied Physics) , 2006, vol. 45, No. 5B, pp. 4303-4308.

Janotti.A et al., "Native Point Defects in ZnO", Phys. Rev. B (Physical Review. B), Oct. 4, 2007, vol. 76, No. 16, pp. 165202-1-165202-22.

Park.J et al., "Electronic Transport Properties of Amorphous Indium-Gallium-Zinc Oxide Semicondutor Upon Exposure to Water", Appl. Phys. Lett. (Applied Physics Letters) , 2008, vol. 92, pp. 072104-1-072104-3.

Hsieh.H et al., "P-29:Modeling of Amorphous Oxide Semiconductor Thin Film Transistors and Subgap Density of States", SID Digest '08 : SID International Symposium Digest of Technical Papers, May 20, 2008, vol. 39, pp. 1277-1280.

Janotti.A et al., "Oxygen Vacancies in ZnO", Appl. Phys. Lett. (Applied Physics Letters) , 2005, vol. 87, pp. 122102-1-122102-3.

Oba.F et al., "Defect energetics in ZnO: A hybrid Hartree-Fock density functional study", Phys. Rev. B (Physical Review. B), 2008, vol. 77, pp. 245202-1-245202-6.

Orita.M et al., "Amorphous transparent conductive oxide InGaO3(ZnO)m (m<4):a Zn4s conductor", Philosophical Magazine, 2001, vol. 81, No. 5, pp. 501-515.

Hosono.H et al., "Working hypothesis to explore novel wide band gap electrically conducting amorphous oxides and examples", J. Non-Cryst. Solids (Journal of Non-Crystalline Solids), 1996, vol. 198-200, pp. 165-169.

Mo.Y et al., "Amorphous Oxide TFT Backplanes for Large Size AMOLED Displays", IDW '08 : Proceedings of the 6th International Display Workshops, Dec. 3, 2008, pp. 581-584.

Kim.S et al., "High-Performance oxide thin film transistors passivated by various gas plasmas", 214th ECS Meeting, 2008, No. 2317, ECS.

Clark.S et al., "First Principles Methods Using CASTEP", Zeitschrift fur Kristallographie, 2005, vol. 220, pp. 567-570.

Lany.S et al., "Dopability, Intrinsic Conductivity, and Nonstoichiometry of Transparent Conducting Oxides", Phys. Rev. Lett. (Physical Review Letters), Jan. 26, 2007, vol. 98, pp. 045501-1-045501-4.

Park.J et al., "Dry etching of ZnO films and plasma-induced damage to optical properties", J. Vac. Sci. Technol. B (Journal of Vacuum Science & Technology B), Mar. 1, 2003, vol. 21, No. 2, pp. 800-803.

Oh.M et al., "Improving the Gate Stability of ZnO Thin-Film Transistors With Aluminum Oxide Dielectric Layers", J. Electrochem. Soc. (Journal of the Electrochemical Society), 2008, vol. 155, No. 12, pp. H1009-H1014.

Ueno.K et al., "Field-Effect Transistor on SrTiO3 With Sputtered Al2O3 Gate Insulator", Appl. Phys. Lett. (Applied Physics Letters), Sep. 1, 2003, vol. 83, No. 9, pp. 1755-1757.

Ishii.T et al., "A Poly-Silicon TFT With a Sub-5-nm Thick Channel for Low-Power Gain Cell Memory in Mobile in Mobile Applications", IEEE Transactions on Electron Devices, Nov. 1, 2004, vol. 51, No. 11, pp. 1805-1810.

Kim.W et al., "An Experimental High-Density DRAM Cell with a Built-in Gain Stage", IEEE Journal of Solid-State Circuits, Aug. 1, 1994, vol. 29, No. 8, pp. 978-981.

Shukuri.S et al., "A Complementary Gain Cell Technology for sub-1 V Supply DRAMs", IEDM 92: Technical Digest of International Electron Devices Meeting, Dec. 13, 1992, pp. 1006-1008. Eng.

Shukuri.S et al., "A Semi-Static Complementary Gain Cell Technology for Sub-1 V Supply DRAM's", IEEE Transactions on Electron Devices, Jun. 1, 1994, vol. 41, No. 6, pp. 926-931.

Kamiya.T et al., "Carrier transport properties and electronic structures of amorphous oxide semiconductors: the present status", Solid State Physics, Sep. 1, 2009, vol. 44, No. 9, pp. 621-633, Agne Gijutsu Center.

Naito.T et al., "World's first monolithic 3D-FPGA with TFT SRAM over 90nm 9 layer Cu CMOS", 2010 Symposium on VLSI Technology : Digest of Technical Papers, Jun. 15, 2010, pp. 219-220.

Song.I et al., "Short Channel Characteristics of Gallium-Indium-Zinc-Oxide Thin Film Transistors for Three-Dimensional Stacking Memory", IEEE Electron Device Letters, Jun. 1, 2008, vol. 29, No. 6, pp. 549-552.

Chinese Office Action (Application No. 201080062032.4) dated Sep. 4, 2014.

Nomura.K et al., "Subgap states in transparent amorphous oxide semiconductor, In—Ga—Zn—O, observed by bulk sensitive x-ray photoelectron spectroscopy", Appl. Phys. Lett. (Applied Physics Letters) , 2008, vol. 92, pp. 202117-1-202117-3.

Yabuta.H et al., "High-Mobility Thin-Film Transistor With Amorphous InGaZnO4 Channel Fabricated by Room Temperature RF-Magnetron Sputtering", Appl. Phys. Lett. (Applied Physics Letters), 2006, vol. 89, pp. 112123-1-112123-3.

Singapore Search Report (Application No. 10201500353W) dated May 21, 2015.

Singapore Written Opinion (Application No. 10201500353W) dated May 21, 2015.

Malaysian Office Action (Application No. 2012-700442) dated Apr. 29, 2016.

Taiwanese Office Action (Application No. 106114991) dated Sep. 4, 2017.

Korean Office Action (Application No. 2017-7029955) dated Nov. 26, 2017.

Korean Office Action (Application No. 2018-7021205) Dated Oct. 16, 2018.

* cited by examiner

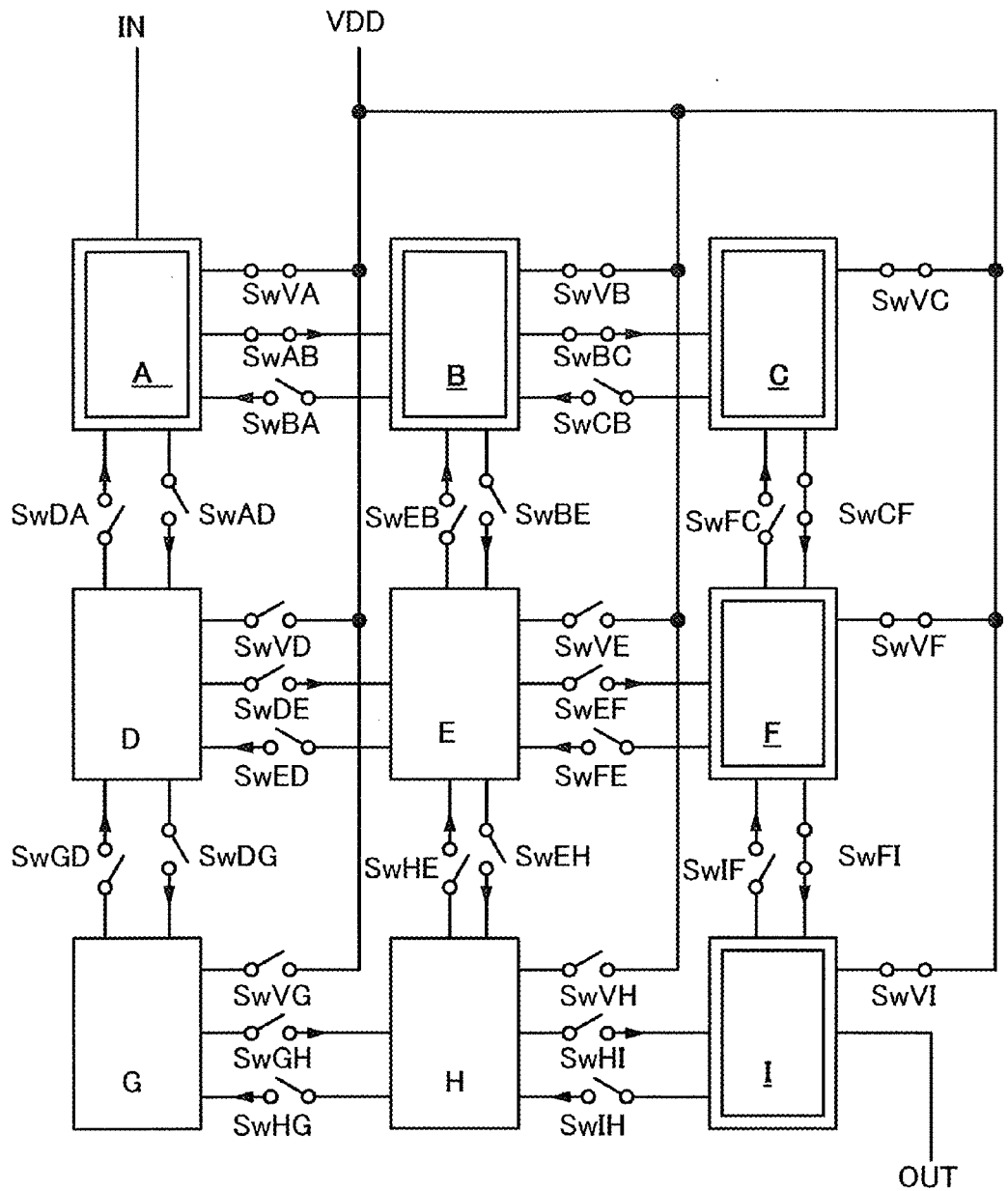

FIG. 9A
FIG. 9B
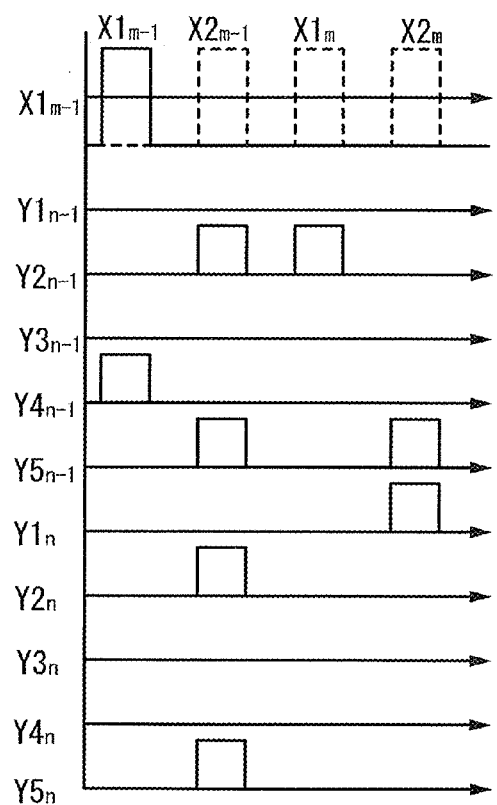
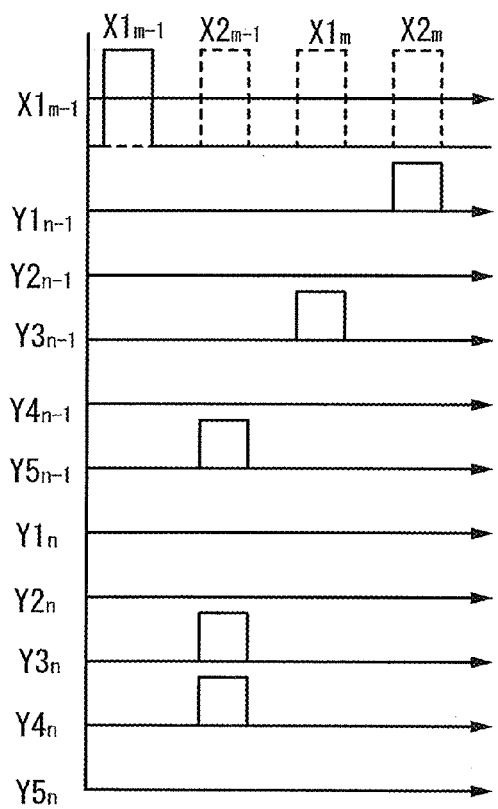

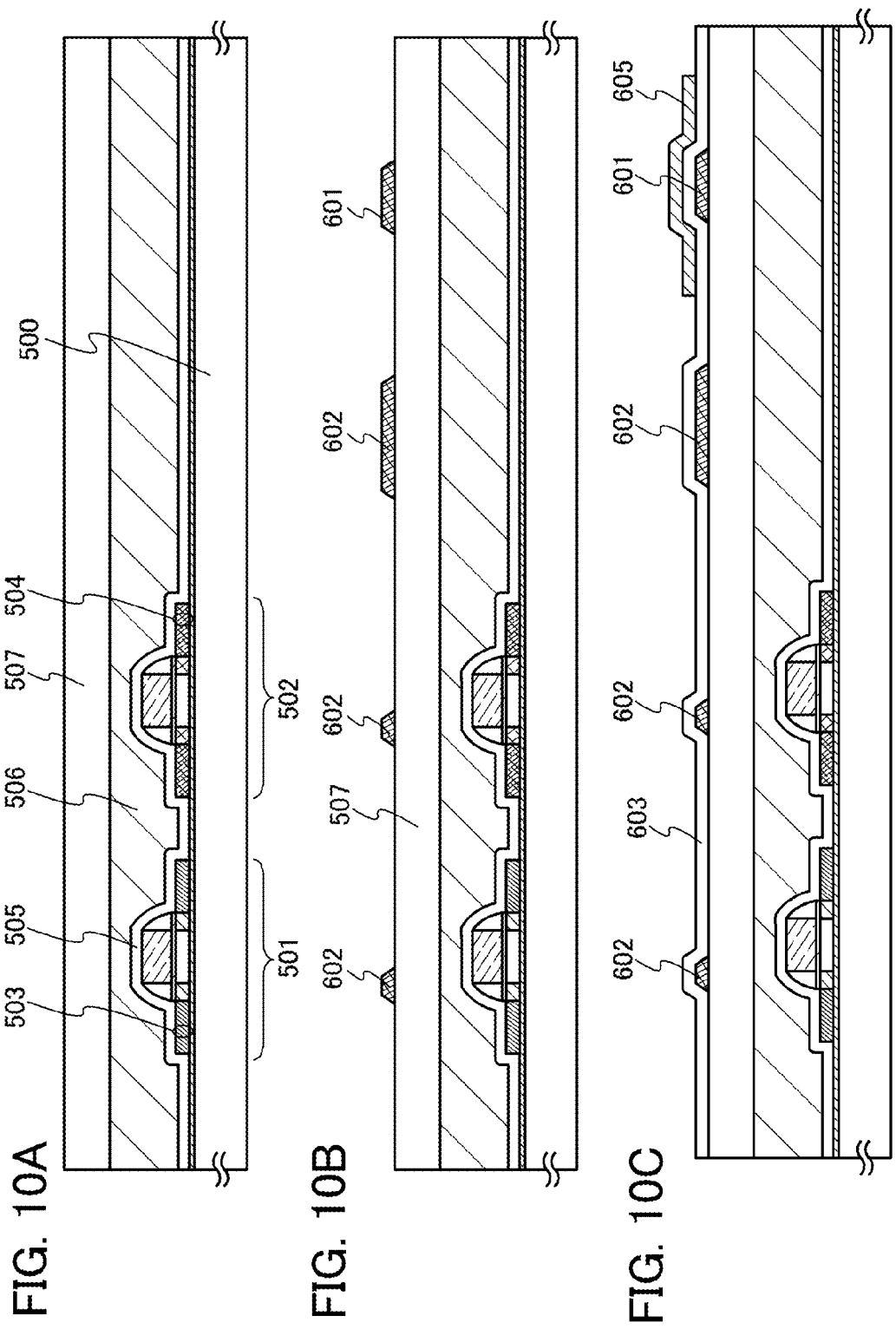

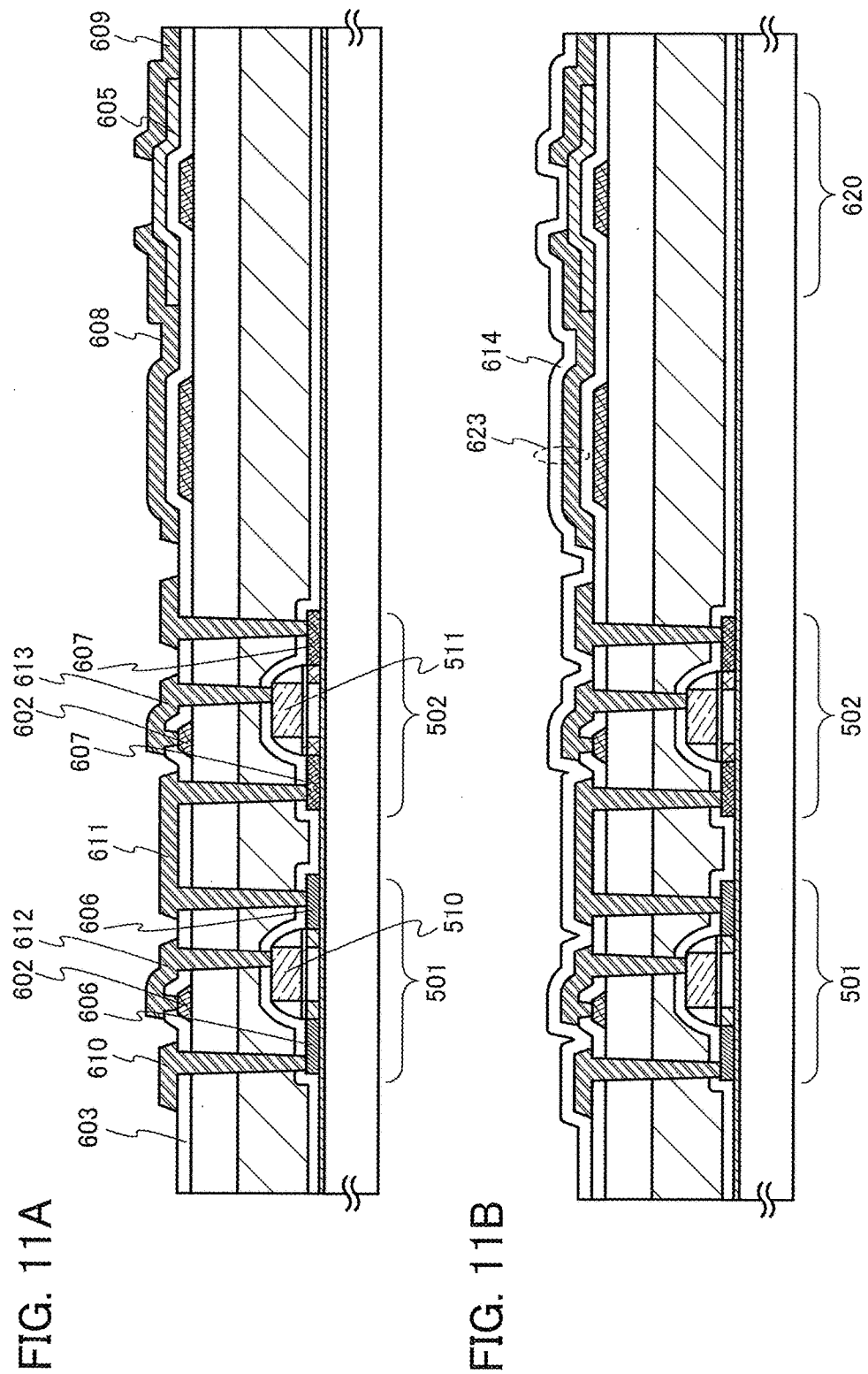

Energy band diagram along the cross section B-B' (VG>0)

Energy band diagram along the cross section B-B' (VG<0)

SEMICONDUCTOR DEVICE

TECHNICAL FIELD

The present invention relates to a semiconductor device including a semiconductor element using an oxide semiconductor.

BACKGROUND ART

In recent years, a metal oxide exhibiting semiconductor characteristics and called oxide semiconductor has attracted attention as a novel semiconductor material having higher mobility and higher reliability than amorphous silicon, and having uniform element characteristics. Metal oxides are used for various applications. For example, indium oxide is a well-known metal oxide and used as a material of a transparent electrode included in a liquid crystal display device or the like. Examples of such metal oxides having semiconductor characteristics include tungsten oxide, tin oxide, indium oxide, and zinc oxide. Thin film transistors whose channel formation region is formed using such a metal oxide having semiconductor characteristics are known (Patent Documents 1 and 2).

REFERENCE

[Patent Document 1] Japanese Published Patent Application No. 2007-123861

[Patent Document 2] Japanese Published Patent Application No. 2007-96055

DISCLOSURE OF INVENTION

Conventionally, in semiconductor integrated circuits such as a normal central processing unit (CPU), the circuits are designed in advance and cannot be changed after manufacturing. In contrast, in a semiconductor integrated circuit called a programmable logic device (PLD), a logic circuit is formed using basic block units having an adequate structure and interconnections between the basic block units can be changed after manufacturing. Therefore, the PLD has high versatility because a circuit configuration can be changed by a user, and the time and cost spent on design and development of a circuit can be greatly reduced.

The PLD includes a complex PLD (CPLD), a field programmable gate array (FPGA), and the like. When the program of the circuit configuration can be rewritten without limitation, the circuit configuration of any of the above PLDs is set in accordance with a structure of connections between basic blocks which is stored in a semiconductor memory such as an EEPROM or an SRAM. Depending on the circuit configuration which is programmed, there can be a case where a basic block does not contribute to the circuit configuration. In particular, as a PLD has a larger size and higher versatility, the number of basic blocks increases; since the circuit configuration is customized for a specific use, the number of basic blocks which do not contribute to the circuit configuration increases.

However, power supply voltage is supplied also to the basic blocks which do not contribute to the circuit configuration in the PLD. Therefore, in the basic blocks, various capacitance including parasitic capacitance are charged and discharged wastefully, so that power is consumed. When the power supply voltage is supplied, unnecessary power consumption occurs in the basic blocks due to leakage current or off-state current. For example, in the case where an inverter is formed using a CMOS, although, ideally, power is not consumed in a steady state, power is consumed in practice due to leakage current which flows to a gate insulating film or to off-state current which flows between a source electrode and a drain electrode. In the case where a CMOS inverter is formed using bulk silicon, an off-state current of approximately 1 pA is generated at a room temperature with a power supply voltage of approximately 3 V. When high integration of the PLD is achieved, power consumption is expected to be increased due to miniaturization of a semiconductor element or an increase in the number of elements.

In the case of using a rewritable PLD, the EEPROM or the SRAM is generally used as a programming cell for storing a structure of connections. However, since the EEPROM writes and erases data utilizing the principle of tunneling current, deterioration of an insulating film easily occurs. Accordingly, in practice, the number of times of rewriting data is not infinite, and the upper limit of the number of rewritings is approximately tens of thousands of times to hundreds of thousands of times. In addition, an absolute value of the voltage applied to the EEPROM when data is written and when data is erased is as high as around 20 V. Therefore, power consumption easily increases when data is written and when data is erased. In addition, a redundant circuit design for covering the size of the above operating voltage is necessary.

On the other hand, the SRAM always needs the supply of power supply voltage to hold data. Accordingly, power is consumed even in a steady state while the power supply voltage is supplied, as described above; therefore, if the number of programming cells using the SRAM increases with high integration, power consumption of a semiconductor device increases.

In view of the above problems, it is an object of the present invention to provide a semiconductor device which can reduce power consumption. It is another object of the present invention to provide a highly reliable semiconductor device using a programming cell.

In a semiconductor device according to one embodiment of the present invention, in accordance with changing of a structure of connections between basic blocks, presence or absence of the supply of the power supply voltage to the basic blocks is changed. That is, when changing of the structure of the connection between the basic blocks generates a basic block which does not contribute the circuit configuration, the supply of the power supply voltage to the basic block in question is stopped.

In one embodiment of the present invention, the supply of the power supply voltage to the basic blocks is controlled using a programming cell formed using an insulated gate field effect transistor (hereinafter simply referred to as a transistor) with extremely low off-state current or extremely low leakage current. The band gap of the above transistor is wider than that of a silicon semiconductor, and a channel formation region of the transistor includes a semiconductor material whose intrinsic carrier density is lower than that of silicon. A semiconductor material having such characteristics is included in a channel formation region, so that a transistor with extremely low off-state current can be realized. As examples of such a semiconductor material, an oxide semiconductor having a band gap which is approximately three times as large as that of silicon can be given.

In one embodiment of the present invention, the transistor with extremely low off-state current or extremely low leakage current is used for a programming cell for controlling a connection between the basic blocks.

Unless otherwise specified, in this specification, in the case of an n-channel transistor, an off-state current is a current which flows between a source electrode and a drain electrode when a potential of the drain electrode is higher than that of the source electrode or that of a gate electrode while a potential of the gate electrode is less than or equal to zero when a reference potential is the potential of the source electrode. Alternatively, in this specification, in the case of a p-channel transistor, an off-state current is current which flows between a source electrode and a drain electrode when a potential of the drain electrode is lower than that of the source electrode or that of a gate electrode while the potential of the gate electrode is greater than or equal to zero when a reference potential is the potential of the source electrode.

Specifically, the above programming cell includes at least a first transistor functioning as a switching element for controlling a connection between two nodes and a second transistor for controlling the supply of a potential to a gate electrode of the above first transistor. The second transistor includes a channel formation region formed using a semiconductor material, such as an oxide semiconductor, which has a band gap approximately three times as large as that of silicon, and an off-state current or a leakage current extremely low. Accordingly, the voltage (gate voltage) between the gate electrode and the source electrode of the first transistor is held for a long time by the second transistor which has extremely low off-state current or extremely low leakage current.

An oxide semiconductor is a metal oxide exhibiting semiconductor characteristics, which includes a high mobility which is almost the same as that of microcrystalline silicon or polycrystalline silicon, and a uniformity in characteristics of elements which is almost the same as that of amorphous silicon. An oxide semiconductor highly-purified (a purified OS) by reduction in concentration of impurities such as moisture or hydrogen, which serves as electron donors (donors), is an intrinsic semiconductor (an i-type semiconductor) or a substantially intrinsic semiconductor. Therefore, a transistor including the above oxide semiconductor has a characteristic of extremely low off-state current or extremely low leakage current. Specifically, the hydrogen concentration in the highly-purified oxide semiconductor which is measured by secondary ion mass spectrometry (SIMS) is less than or equal to $5\times10^{19}/cm^3$, preferably less than or equal to $5\times10^{18}/cm^3$, more preferably less than or equal to $5\times10^{17}/cm^3$, still more preferably less than or equal to $1\times10^{16}/cm^3$. In addition, the carrier density of the oxide semiconductor film, which is measured by Hall effect measurement, is less than $1\times10^{14}/cm^3$, preferably less than $1\times10^{12}/cm^3$, more preferably less than $1\times10^{11}/cm^3$. Furthermore, the band gap of the oxide semiconductor is greater than or equal to 2 eV, preferably greater than or equal to 2.5 eV, more preferably greater than or equal to 3 eV. With the use of the oxide semiconductor film which is highly purified by sufficiently reducing the concentration of impurities such as moisture or hydrogen, off-state current or leakage current of the transistor can be reduced.

The analysis of the hydrogen concentration in the oxide semiconductor film is described here. It is known that it is, in principle, difficult to obtain data accurately in the proximity of a surface of a sample or in the proximity of an interface between stacked films formed using different materials by the SIMS analysis principle. Thus, in the case where distributions of the hydrogen concentrations of the film are analyzed by SIMS in thickness directions, when, in a region of the film under study, the value does not vary greatly and an almost constant value can be obtained, an average value is accepted as the hydrogen concentration. Further, in the case where the thickness of the film under study is small, a region with an almost constant value can sometimes not be obtained due to the influence of the hydrogen concentration in adjacent films. In that case, a local maximum value or a local minimum value of the hydrogen concentration in a region of the film is accepted as the hydrogen concentration in the film. Furthermore, in the case where a mountain-shaped peak having the local maximum value and a valley-shaped peak having the local minimum value do not exist in the region where the films are provided, the value at an inflection point is accepted as the hydrogen concentration.

Various experiments can actually prove low off-state current of the transistor including the highly-purified oxide semiconductor film as an active layer. For example, even with an element with a channel width of $1\times10^6$ µm and a channel length of 10 µm, in the range of from 1 V to 10 V of the voltage (drain voltage) between a source electrode and a drain electrode, it is possible that off-state current (which is drain current when the voltage between a gate electrode and the source electrode is less than or equal to 0 V) is less than or equal to the measurement limit of a semiconductor characterization system, that is, less than or equal to $1\times10^{-13}$ A. In that case, it can be found that an off-state current density corresponding to a value obtained by dividing the off-state current by the channel width of the transistor is lower than or equal to 100 zA/µm. Further, in the experiment, a capacitor and a transistor (the thickness of a gate insulating film was 100 nm) were connected to each other and a circuit in which electric charge flowing into or from the capacitor was controlled by the transistor was used. When the highly-purified oxide semiconductor film was used as a channel formation region in the transistor, and the off-state current of the transistor was measured from a change in the amount of electric charge of the capacitor per unit time, it was found that in the case where the voltage between the source electrode and the drain electrode of the transistor was 3 V, lower off-state current of 10 zA/µm to 100 zA/µm was able to be obtained. Therefore, in the semiconductor device relating to one embodiment of the present invention, the off-state current density of the transistor including the highly-purified oxide semiconductor film as an active layer can be lower than or equal to 100 zA/µm, preferably lower than or equal to 10 zA/µm, or more preferably lower than or equal to 1 zA/µm, depending on the voltage between the source electrode and drain electrode. Accordingly, the transistor including the highly-purified oxide semiconductor film as an active layer has much lower off-state current than a transistor including silicon having crystallinity.

A transistor including a highly-purified oxide semiconductor shows almost no temperature dependence of off-state current. This is because an impurity serving as an electron donor (donor) in the oxide semiconductor is removed and the oxide semiconductor is highly purified, so that a conductivity type is close to a substantially intrinsic type and the Fermi level is located in the center of the forbidden band. This also results from the fact that the oxide semiconductor has an energy gap of greater than or equal to 3 eV and includes very few thermally excited carriers. In addition, the source electrode and the drain electrode are in a degenerated state, which is also a factor for showing no temperature dependence. The transistor is mainly operated with carriers which are injected from the degenerated source electrode to the oxide semiconductor, and it can be explained that there is no temperature dependence of an off-state current because there is no temperature dependence of carrier density.

As the oxide semiconductor, a quaternary metal oxide such as an In—Sn—Ga—Zn—O-based oxide semiconductor, a ternary metal oxide such as an In—Ga—Zn—O-based oxide semiconductor, an In—Sn—Zn—O-based oxide semiconductor, an In—Al—Zn—O-based oxide semiconductor, a Sn—Ga—Zn—O-based oxide semiconductor, an Al—Ga—Zn—O-based oxide semiconductor, and a Sn—Al—Zn—O-based oxide semiconductor, or a binary metal oxide such as an In—Zn—O-based oxide semiconductor, a Sn—Zn—O-based oxide semiconductor, an Al—Zn—O-based oxide semiconductor, a Zn—Mg—O-based oxide semiconductor, a Sn—Mg—O-based oxide semiconductor, an In—Mg—O-based oxide semiconductor, an In—Ga—O-based oxide semiconductor, an In—O-based oxide semiconductor, a Sn—O-based oxide semiconductor, and a Zn—O-based oxide semiconductor, and the like can be used. Note that in this specification, for example, an In—Sn—Ga—Zn—O-based oxide semiconductor means a metal oxide including indium (In), tin (Sn), gallium (Ga), and zinc (Zn). There is no particular limitation on the stoichiometric composition ratio. The above oxide semiconductor may include silicon.

Alternatively, oxide semiconductors can be represented by the chemical formula, $InMO_3(ZnO)_m$ (m>0). Here, M represents one or more metal elements selected from Ga, Al, Mn, and Co.

According to one embodiment of the present invention, the supply of the power supply voltage to basic blocks which do not contribute to a circuit configuration is stopped by a programming cell, whereby power consumption of a semiconductor integrated circuit can be suppressed.

The programming cell having the above structure can suppress degradation of a gate insulating film by tunneling current, as compared to a conventional programming cell using the EEPROM; therefore, a semiconductor device in which the number of times of rewriting data can increase can be provided.

In the programming cell having the above structure, the operating voltage which is needed for writing of data on a connection state is approximately determined by the operating voltage of the second transistor. Accordingly, compared to the conventional programming cell using the EEPROM, a semiconductor device in which the above operating voltage can be reduced significantly and power consumption is reduced can be provided.

Unlike a programming cell formed using the SRAM, the programming cell having the above structure holds data using a transistor having extremely low off-state current; accordingly, a connection state can be held to some extent even when the power supply voltage is not always supplied to the programming cell. Therefore, a semiconductor device in which power consumption is reduced can be provided.

BRIEF DESCRIPTION OF DRAWINGS

FIG. 3 is a diagram illustrating an operation of a semiconductor device.

FIGS. 9A and 9B are timing charts each illustrating an operation of a semiconductor device.

FIGS. 10A to 10C are views illustrating a method for manufacturing a semiconductor device.

FIGS. 11A and 11B are views illustrating a method for manufacturing a semiconductor device.

BEST MODE FOR CARRYING OUT THE INVENTION

Hereinafter, embodiments of the present invention will be described in detail with reference to the accompanying drawings. However, the present invention is not limited to the following description and it is easily understood by those skilled in the art that the mode and details can be changed in various ways without departing from the spirit and scope of the present invention. Accordingly, the present invention should not be construed as being limited to the description of the embodiments below.

Note that a semiconductor device of the present invention includes, in its category, various semiconductor integrated circuits formed using semiconductor elements such as microprocessors, image processing circuits, controllers for semiconductor display devices, digital signal processor (DSPs), micro controllers, and the like. In addition, the semiconductor device of the present invention also includes, in its category, various devices such as RF tags formed using the above semiconductor integrated circuits, semiconductor display devices, and the like. The semiconductor display devices include the following in its category: liquid crystal display devices, light-emitting devices in which a light-emitting element typified by an organic light-emitting element (OLED) is provided for each pixel, electronic paper, digital micromirror devices (DMDs), plasma display panels (PDPs), field emission displays (FEDs), and other semiconductor display devices in which a semiconductor element is included in a driver circuit.

Embodiment 1

In this embodiment, a structure and operation of a semiconductor device according to one embodiment of the present invention will be described.

Figure 1:
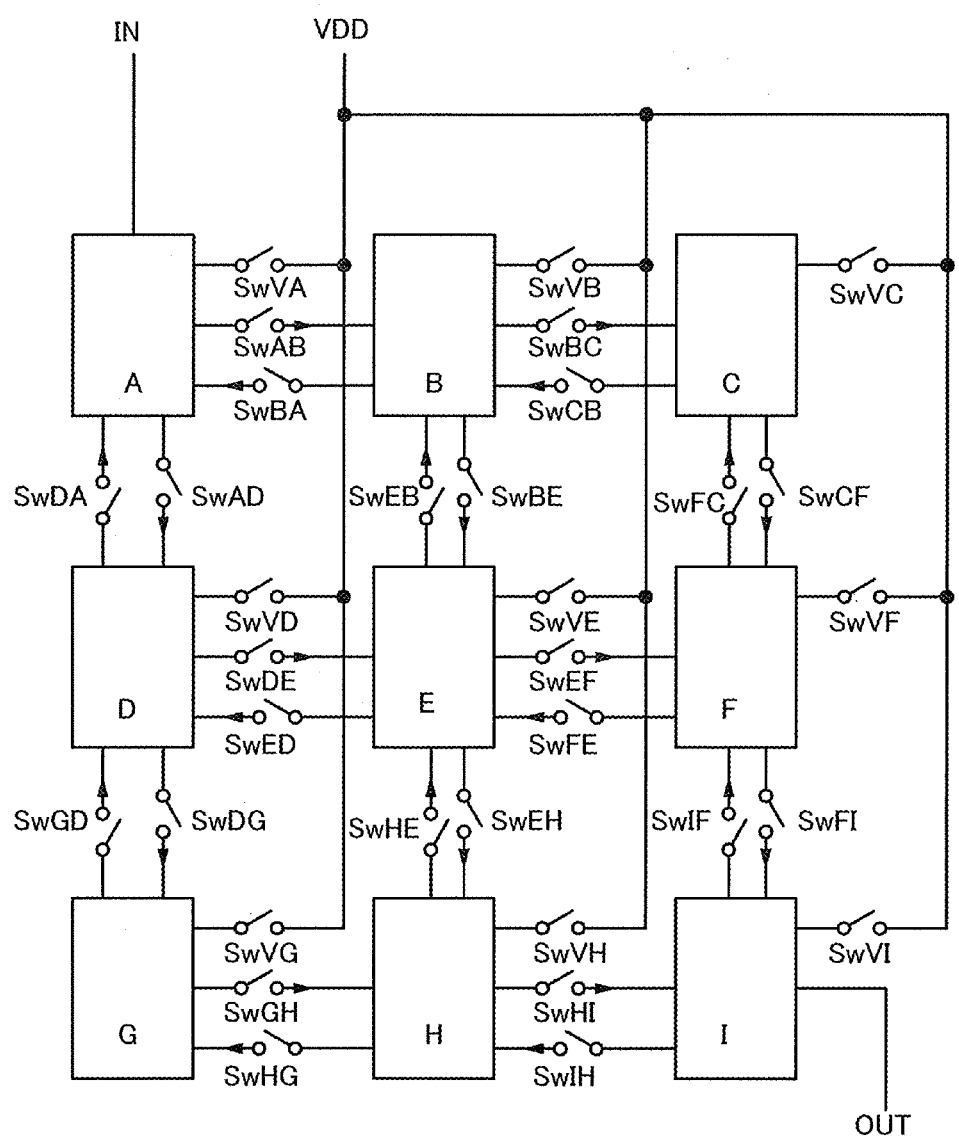
FIG. 1 is a diagram illustrating a structure of a semiconductor device.

A structure of a semiconductor device according to one embodiment of the present invention is illustrated in FIG. 1, as an example. The semiconductor device illustrated in FIG. 1 is provided with nine basic blocks A to I, programming cells SwAB to SwIH configured to control connections between the basic blocks A to I, and programming cells SwVA to SwVI configured to control the supply of a power supply potential VDD to the basic blocks A to I.

Note that in FIG. 1, a programming cell configured to control a connection between an output terminal of the basic block A and an input terminal of the basic block B is denoted as SwAB, for example. On the other hand, a programming cell configured to control a connection between an output terminal of the basic block B and an input terminal of the basic block A is denoted as SwBA.

In FIG. 1, in order to avoid complexity of description, the case in which each of the nine basic blocks is connected to the basic block of up, down, left, or right via the programming cells is illustrated. However, one embodiment of the present invention is not limited to this structure, and a designer can set the number of basic blocks and the structure of the connection, as appropriate.

In FIG. 1, each basic block is connected via the programming cell to a node to which the power supply potential VDD is applied; however, in practice, not only the power supply potential VDD but also a fixed potential which is different from the power supply potential VDD, such as a ground potential, are applied to each basic block. That is, when the power supply potential VDD is applied to the basic blocks, the potential difference between the power supply potential VDD and the above fixed potential is supplied to the basic blocks as power supply voltage.

In FIG. 1, the case where one output terminal of a given basic block is connected to one input terminal of another basic block via the programming cell is described. However, one embodiment of the present invention is not limited to this structure. One output terminal of a given basic block may be connected to a plurality of input terminals of another basic block via programming cells.

Note that there is no particular limitation on the structure of a logic circuit used as the basic block. A logic circuit which performs a simple logic operation such as an inverter, an AND, a NAND, or a NOR; an adder; a multiplier; a memory (e.g., a DRAM or the SRAM); or various arithmetic units can be used as the basic block.

Each programming cell includes at least a first transistor (Tr1) which controls a connection between two nodes and a second transistor (Tr2) which controls the supply of a potential to a gate electrode of the first transistor. Specifically, structural examples of the programming cells are illustrated in FIGS. 2A to 2C.

Figure 2A:
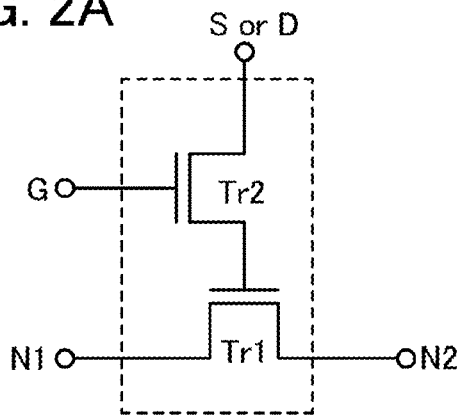
FIGS. 2A to 2C each illustrate a circuit diagram of a programming cell.
Figure 2B:
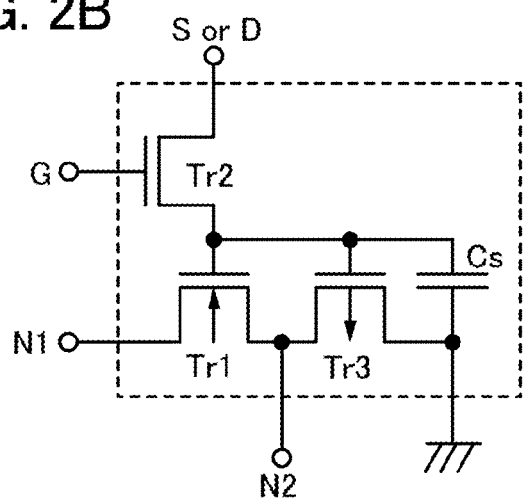
Figure 2C:
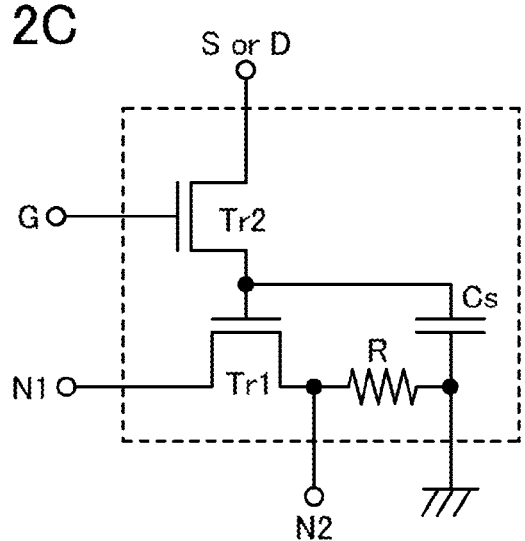

FIG. 2A is an example of a programming cell having the simplest structure, and the programming cell includes the first transistor (Tr1) which controls a connection between two nodes and the second transistor (Tr2) which controls the supply of a potential to a gate electrode of the first transistor (Tr1). Specifically, a source electrode of the first transistor (Tr1) is connected to a node N1 and a drain electrode of the first transistor (Tr1) is connected to a node N2. Further, one of the source electrode (denoted as S) and the drain electrode (denoted as D) of the second transistor (Tr2) is connected to the gate electrode of the first transistor (Tr1), and a potential of a signal (Sig1) for controlling switching of the first transistor (Tr1) is applied to the other of the source electrode (denoted as S) and the drain electrode (denoted as D) of the second transistor (Tr2).

Note that a capacitor for holding a potential of the gate electrode of the first transistor (Tr1) may be provided.

When the second transistor (Tr2) is turned on in accordance with a signal input to a gate electrode of the second transistor (Tr2), a potential of a signal for controlling switching of the first transistor (Tr1) is applied to the gate electrode of the first transistor (Tr1). The first transistor (Tr1) performs switching in accordance with the potential applied to the gate electrode of the first transistor (Tr1). When the first transistor (Tr1) is on, the node N1 is connected to the node N2. In contrast, when the first transistor (Tr1) is off, the node N1 is not connected to the node N2, and one of these nodes is in a high impedance state.

Next, when the second transistor (Tr2) is turned off in accordance with a signal input to the gate electrode of the second transistor (Tr2), the gate electrode of the first transistor (Tr1) is in a floating state, and the potential is held. Accordingly, a connection state between the node N1 and the node N2 is held.

Note that "connection" in this specification refers to electrical connection and corresponds to the state in which current, voltage, or potential can be applied or transmitted. Therefore, the state of connection does not always mean a state of direct connection, but includes in its category a state of indirect connection via a circuit element such as a wiring, a resistor, a diode, or a transistor, in which current, voltage, or potential can be supplied or transmitted.

Note also that even when a circuit diagram illustrates independent components which are connected to each other, there is the case where one conductive film has functions of a plurality of components such as the case where part of a wiring also functions as an electrode. The "connection" in this specification includes in its category such a case where one conductive film has functions of a plurality of components.

The names of the "source electrode" and the "drain electrode" included in the transistor interchange with each other depending on the polarity of the transistor or difference between the levels of potentials applied to the respective electrodes. In general, in an n-channel transistor, an electrode to which a lower potential is applied is called a source electrode, and an electrode to which a higher potential is applied is called a drain electrode. Further, in a p-channel transistor, an electrode to which a lower potential is applied is called a drain electrode, and an electrode to which a higher potential is applied is called a source electrode. In this specification, for convenience, although the connection relation of the transistor is described assuming that the source electrode and the drain electrode are fixed in some cases; however, actually, the names of the source electrode and the drain electrode interchange with each other depending on the relation between the above potentials.

Note that in the case of using a programming cell for controlling a connection between the basic blocks, the node N1 is connected to an input terminal or an output terminal of one basic block, and the node N2 is connected to an input terminal or an output terminal of another basic block. In the case of using a programming cell for controlling the supply of the power supply voltage to the basic block, the basic block is connected to one of the node N1 and the node N2, and the power supply potential VDD is applied to the other of the node N1 and the node N2.

Next, an example of another programming cell is illustrated in FIG. 2B. The programming cell illustrated in FIG. 2B includes the first transistor (Tr1) which controls a connection between two nodes, the second transistor (Tr2) which controls the supply of a potential to the gate electrode of the first transistor (Tr1), and a third transistor (Tr3) which controls a connection between one of the above two nodes and a node to which a fixed potential VSS is applied.

Specifically, the source electrode of the first transistor (Tr1) is connected to the node N1 and the drain electrode of the first transistor (Tr1) is connected to the node N2. One of the source electrode and the drain electrode of the second transistor (Tr2) is connected to the gate electrode of the first transistor (Tr1), a potential of a signal for controlling switching of the first transistor (Tr1) is applied to the other of the source electrode and the drain electrode of the second transistor (Tr2). One of the source electrode and the drain electrode of the third transistor (Tr3) is connected to the node N2, and the other is connected to the node to which the fixed potential VSS is applied. The gate electrode of the first transistor (Tr1) is connected to a gate electrode of the third transistor (Tr3). Note that the first transistor (Tr1) is an n-channel transistor, and the third transistor (Tr3) is a p-channel transistor.

The programming cell illustrated in FIG. 2B includes a capacitor Cs for holding a potential of the gate electrode of the first transistor (Tr1). Although the capacitor Cs is not necessarily provided, when the capacitor Cs is provided, a connection state between the node N1 and the node N2 can be held for a longer period of time. Specifically, one of the pair of electrodes of the capacitor Cs is connected to the gate electrode of the first transistor (Tr1), and the other is connected to the node to which the fixed potential VSS is applied.

When the second transistor (Tr2) is turned on in accordance with a signal input to the gate electrode of the second transistor (Tr2), a potential of a signal for controlling switching of the first transistor (Tr1) is applied to the gate electrode of the first transistor (Tr1), the gate electrode of the third transistor (Tr3), and one electrode of the capacitor Cs. The first transistor (Tr1) performs switching in accordance with the potential of the signal applied to the gate electrode of the first transistor (Tr1). Then, the third transistor (Tr3) performs switching which is opposite to that of the first transistor (Tr1) because the polarity of the third transistor (Tr3) is different from that of the first transistor (Tr1).

For example, when the first transistor (Tr1) is turned on, the third transistor (Tr3) is turned off. As a result, the node N1 is connected to the node N2. In contrast, when the first transistor (Tr1) is turned off, the third transistor (Tr3) is turned on. As a result, the node N1 is not connected to the node N2, and the node N2 is connected to the node to which the fixed potential VSS is applied.

Next, when the second transistor (Tr2) is turned off in accordance with a signal input to the gate electrode of the second transistor (Tr2), the gate electrode of the first transistor (Tr1) and the gate electrode of the third transistor (Tr3) are in a floating state, and the potential of the gate electrodes is held in the capacitor Cs. Accordingly, a connection state between the node N1 and the node N2 and a connection state between the node N2 and the node to which the fixed potential VSS is applied are held.

Note that in FIG. 2B, a p-channel transistor is used for the third transistor (Tr3); however, when a p-channel type is not generally obtained similarly to an oxide semiconductor, or with a very low mobility. Therefore, a resistor R can be used instead of a p-channel transistor, as illustrated in FIG. 2C.

In one embodiment of the present invention, in the programming cells illustrated in FIGS. 2A to 2C, off-state current or leakage current of the second transistor (Tr2) is extremely low. Specifically, a channel formation region of the second transistor (Tr2) includes a semiconductor material whose band gap is wider than that of a silicon semiconductor and whose intrinsic carrier density is lower than that of silicon. When a semiconductor material having such characteristics is included in a channel formation region, a transistor with extremely low off-state current can be realized.

As an example of the semiconductor material whose band gap is wider than that of a silicon semiconductor and whose intrinsic carrier density is lower than that of silicon, a compound semiconductor such as silicon carbide (SiC) or gallium nitride (GaN), an oxide semiconductor formed using a metal oxide such as zinc oxide (ZnO), or the like can be used. Of these, the oxide semiconductor is advantageous in that it can be formed by a sputtering method or a wet method (printing method or the like) and it is superior in mass production. If silicon carbide and gallium nitride do not form a single crystal, silicon carbide and gallium nitride do not obtain satisfactory characteristics. The process temperature of silicon carbide for forming a single crystal is approximately 1500° C., and the process temperature of gallium nitride for forming a single crystal is approximately 1100° C. However, the film formation temperature of the oxide semiconductor is as low as 300° C. to 500° C. (at the maximum, approximately 700° C.), and a semiconductor element formed using an oxide semiconductor can be stacked over an integrated circuit formed using a semiconductor material such as single crystal silicon. Further, the oxide semiconductor can accompany an increase in the size of a substrate. Accordingly, of the above semiconductor with a wide band-gap, particularly, the oxide semiconductor has an advantage of high mass production efficiency. In addition, a crystalline oxide semiconductor having a superior performance (e.g., field-effect mobility) can be easily obtained by a heat treatment comprised between 450° C. and 800° C.

When an oxide semiconductor is used for the second transistor (Tr2), it is preferable that the above oxide semiconductor have a band gap of greater than or equal to 3 eV, and a carrier density of less than $10^{12}/cm^3$, preferably, less than $10^{11}/cm^3$. Specifically, the hydrogen concentration in the above oxide semiconductor, which is measured by SIMS, is less than or equal to $5\times10^{19}/cm^3$, preferably less than or equal to $5\times10^{18}/cm^3$, more preferably less than or equal to $5\times10^{17}/cm^3$, still more preferably less than or equal to $1\times10^{16}/cm^3$. When an oxide semiconductor having the above characteristics is used, off-state current or leakage current of the second transistor (Tr2) can be reduced.

The gate insulating film of the second transistor (Tr2) preferably has a thickness of greater than or equal to 10 nm, more preferably greater than or equal to 100 nm. The channel length of the second transistor (Tr2) is preferably greater than or equal to 100 nm, more preferably greater than or equal to 300 nm. When the above structure is adopted, off-state current or leakage current of the second transistor (Tr2) can be reduced.

In this way, when the second transistor (Tr2) with remarkably low off-state current or remarkably low leakage current is used, the supply of a potential to the gate electrode of the first transistor is controlled, whereby the gate voltage of the first transistor is held for a long time. Therefore, the connection state between the node N1 and the node N2 can also be held for a long time.

In order to further reduce off-state current or leakage current of the second transistor (Tr2) when the connection state is held, the potential of the gate electrode of the second transistor (Tr2) may be set to be the lowest among the programming cells. Specifically, it is preferable that the potential of the gate electrode of the second transistor (Tr2)

be lower than any other potentials by greater than or equal to 3 V, more preferably greater than or equal to 5 V among potentials of electrodes and terminals included in all circuit elements which form the programming cells such as a transistor, a capacitor, or a resistor.

A channel formation region of the first transistor (Tr1) or the third transistor (Tr3) may include a semiconductor material whose band gap is wider than that of a silicon semiconductor and whose intrinsic carrier density is lower than that of silicon in a manner similar to that of the second transistor (Tr2), or unlike the second transistor (Tr2), the channel formation region of the first transistor (Tr1) or the third transistor (Tr3) may include a semiconductor material which has higher mobility. As examples of a semiconductor material having high mobility, germanium, silicon, and silicon germanium which have crystallinity such as polycrystalline or single crystal, and single crystal silicon carbide can be given. The first transistor (Tr1) or the third transistor (Tr3) may be formed using a semiconductor thin film, or may be formed using a bulk semiconductor substrate.

In the former case, since the first transistor (Tr1) or the third transistor (Tr3) has low off-state current or low leakage current similar to that of the second transistor (Tr2), power consumption of a semiconductor device can be further reduced. In particular, in the case of using the programming cell which controls the supply of the power supply potential VDD to the basic block, a field-effect mobility of the first transistor (Tr1) of approximately 10 $cm^2V^{-1} s^{-1}$ is sufficient for operation and not so high operating speed is required. Off-state current or leakage current generated in the programming cell which controls the supply of the power supply potential VDD to the basic block directly leads to an increase in power consumption. Therefore, in the case of using the programming cell which controls the supply of the power supply potential VDD to the basic block, the former structure is preferably adopted.

In the latter case, the mobility of the first transistor (Tr1) increases; therefore, resistance between the nodes connected with the first transistor (Tr1) can be reduced. In particular, in the case of using the programming cell for controlling a connection between the basic blocks, high connection resistance between the basic blocks leads to a decrease in operating speed of a semiconductor device. Therefore, in the case of using the programming cell for controlling a connection between the basic blocks, the latter structure is preferably adopted. Note that when the channel formation region of the first transistor (Tr1) includes a semiconductor material which has higher mobility, the thickness of the gate insulating film is preferably greater than or equal to 10 nm in order to reduce off-state current or leakage current.

Note that when each channel formation region of the second transistor (Tr2), the first transistor (Tr1), and the third transistor (Tr3) has the same semiconductor material, the first transistor (Tr1) and the third transistor (Tr3) may be formed in the same layer as the second transistor (Tr2). In that case, the thickness of each of the gate insulating film of the first transistor (Tr1) and the third transistor (Tr3) is the same as that of the second transistor (Tr2) in design; however, the channel length or the channel width of the first transistor (Tr1) and the third transistor (Tr3) may be different from that of the second transistor (Tr2). For example, when the channel formation region of the first transistor (Tr1) is desired to have low resistance, the channel width may be twice or more as large as that of the second transistor (Tr2), preferably five or more times as large as that of the second transistor (Tr2).

Further, the first transistor (Tr1) may be formed by a non-self-aligned method. By the non-self-aligned method, although parasitic capacitance occurs due to overlap of the gate electrode and the source electrode or the drain electrode, not so high speed operation is required for the first transistor (Tr1), and the above parasitic capacitance does not become a problem. Instead, the above parasitic capacitance functions as the capacitor (Cs) which holds the potential of the gate electrode of the first transistor (Tr1). On the other hand, the parasitic capacitance of the second transistor (Tr2) is preferably low in order to prevent generation of a change in the potential of the gate electrode of the first transistor (Tr1) in switching.

Even when the same semiconductor material as that of the transistor which forms the basic block is used for the first transistor (Tr1), the thickness of the gate insulating film is preferably larger than that of the transistor which forms the basic block in order to reduce leakage current of the first transistor (Tr1). In that case, the first transistor (Tr1) may be formed by the non-self-aligned method, and a conductive film formed in a layer which is different from that of the transistor used for the basic block may be used as the gate electrode.

Note that in FIGS. 2A to 2C, the first transistor (Tr1), the second transistor (Tr2), and the third transistor (Tr3) each have the gate electrode only on one side of the semiconductor film. However, one embodiment of the present invention is not limited to this structure, and the above transistors may have a back gate electrode which is opposite to the side of the gate electrode with the semiconductor film interposed therebetween. In that case, the back gate electrode may be electrically insulated to be in a floating state, or may be in a state where the back gate electrode is supplied with a potential. In the latter case, the gate electrode may be electrically connected to the back gate electrode, or a fixed potential such as a ground potential may be always applied only to the back gate electrode. The level of the potential applied to the back gate electrode is controlled, whereby threshold voltage of the transistor can be controlled.

The programming cell which can be used for the semiconductor device is not limited to the circuit configuration illustrated in FIGS. 2A to 2C. The programming cell may include at least the first transistor for controlling a connection between two nodes and the second transistor for controlling the supply of the potential to the gate electrode of the above first transistor, and the channel formation region of the second transistor may include a semiconductor material such as an oxide semiconductor having a band gap which is approximately three times as large as that of silicon.

Next, an operation of a semiconductor device when a plurality of basic blocks is arbitrarily connected using programming cells having the above structure will be described.

In the semiconductor device illustrated in FIG. 1, a connection between all the basic blocks is cut, and the supply of the power supply voltage to all the basic blocks is stopped. From the state illustrated in this FIG. 1, a state in which the basic blocks are connected when some of the programming cells are on is illustrated in FIG. 3. Specifically, in FIG. 3, when the programming cell SwAB, the programming cell SwBC, the programming cell SwCF, and the programming cell SwFI are turned on, the output terminal of the basic block A is connected to the input terminal of the basic block B, the output terminal of the basic block B is connected to an input terminal of the basic block C, an output terminal of the basic block C is connected to an input terminal of the basic block F, and an output terminal of the basic block F is connected to an input terminal of the basic block I. When the programming cell SwVA, the programming cell SwVB, the programming cell SwVC, the programming cell SwVF, and the programming cell SwVI are turned on, the power supply potential VDD is applied to the basic block A, the basic block B, the basic block C, the basic block F, and the basic block I. Then, all the programming cells except the above programming cells are off. As a result, as illustrated in FIG. 3, a path of a signal from an input terminal (IN) of a semiconductor device to the basic block A, the basic block B, the basic block C, the basic block F, and the basic block I is formed. Then, a first signal processing is performed in each of the above basic blocks, whereby a signal is output from an output terminal (OUT).

In the state illustrated in FIG. 3, when a second signal processing is performed after the first signal processing is performed on the input signal and an output signal is obtained, a connection between the basic blocks is changed. The change of the connection between the basic blocks is preferably performed after the all the programming cells are cut once.

Figure 4:
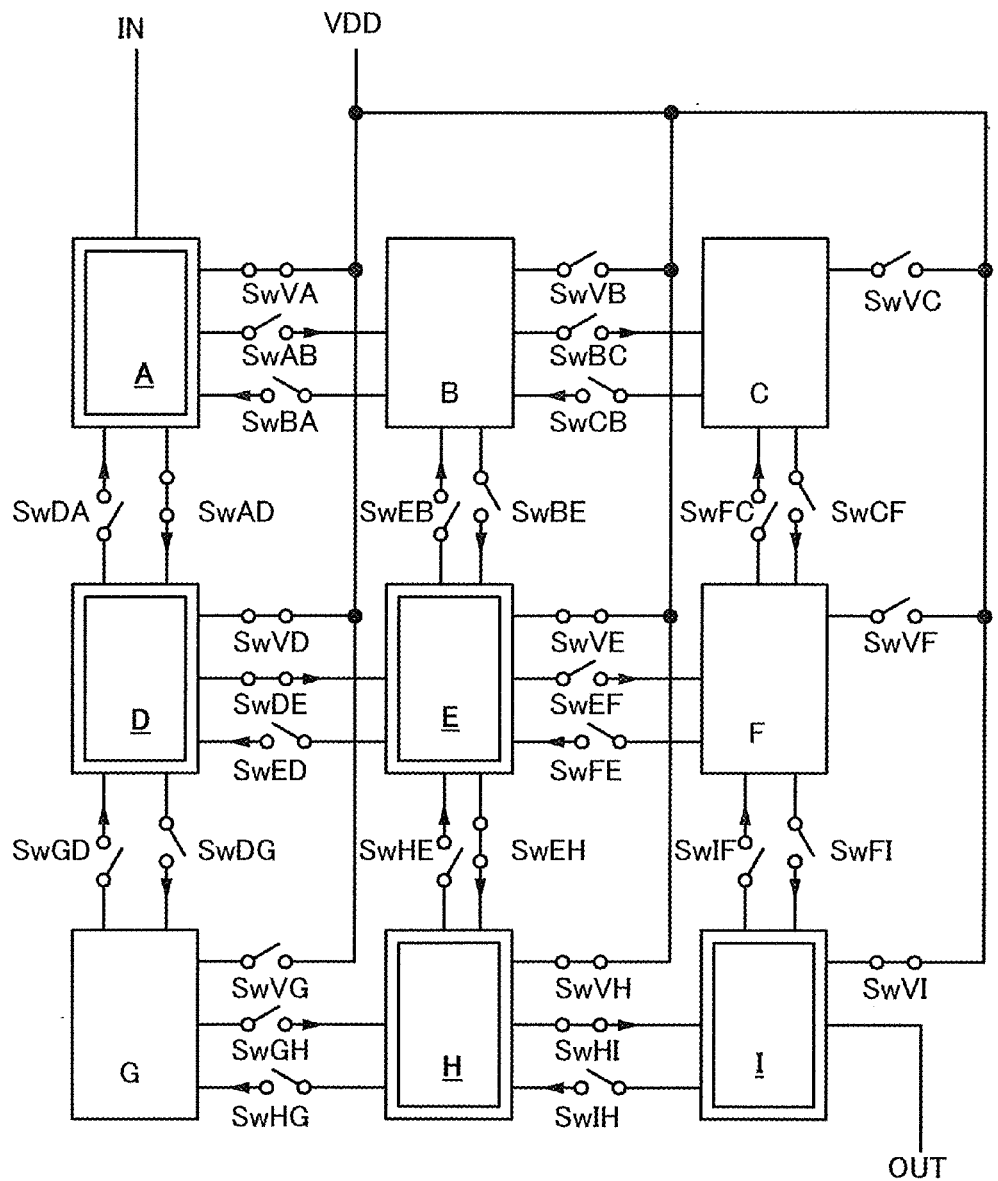
FIG. 4 is a diagram illustrating an operation of a semiconductor device.

An example of a connection state between the basic blocks when the second signal processing is performed is illustrated in FIG. 4. Specifically, in FIG. 4, when the programming cell SwAD, the programming cell SwDE, the programming cell SwEH, and the programming cell SwHI are turned on, the output terminal of the basic block A is connected to an input terminal of the basic block D, an output terminal of the basic block D is connected to an input terminal of the basic block E, an output terminal of the basic block E is connected to an input terminal of the basic block H, and an output terminal of the basic block H is connected to the input terminal of the basic block I. When the element SwVA, the programming cell SwVD, the programming cell SwVE, the programming cell SwVH, and the programming cell SwVI are turned on, the power supply potential VDD is applied to the basic block A, the basic block D, the basic block E, the basic block H, and the basic block I. Then, all the programming cells except the above programming cells are off. As a result, as illustrated in FIG. 4, a path of a signal from the input terminal (IN) of a semiconductor device to the basic block A, the basic block D, the basic block E, the basic block H, and the basic block I is formed. Then, the second signal processing is performed in each of the above basic blocks, whereby a signal is output from the output terminal (OUT).

Figure 5:
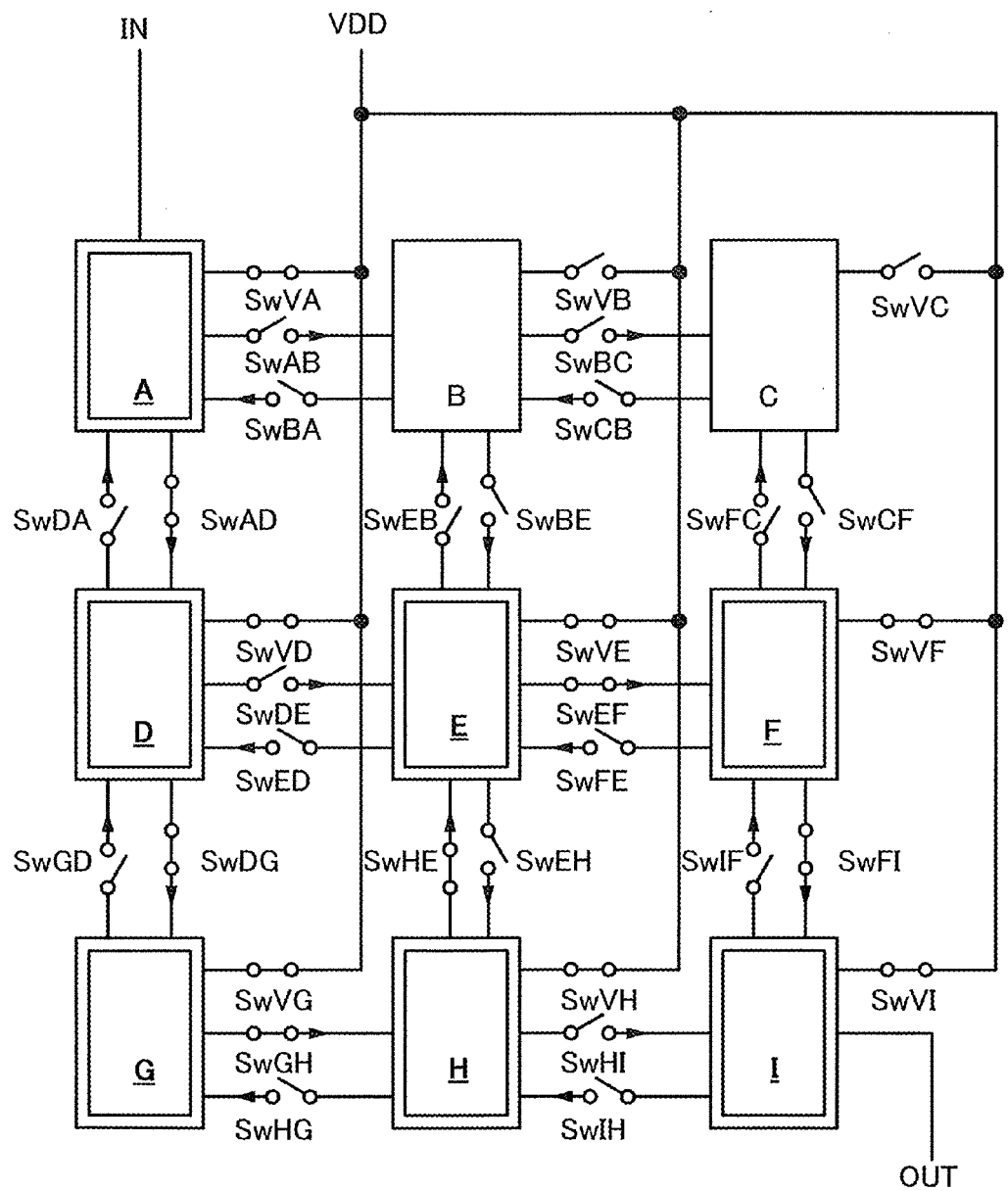
FIG. 5 is a diagram illustrating an operation of a semiconductor device.

Also in the case where a third signal processing is performed, it is preferable to change a connection between the basic blocks after all the programming cells are cut once. An example of a connection state between the basic blocks in performing the third signal processing is illustrated in FIG. 5. Specifically, in FIG. 5, when the programming cell SwAD, the programming cell SwDG, the programming cell SwGH, the programming cell SwHE, the programming cell SwEF, and the programming cell SwFI are turned on, the output terminal of the basic block A is connected to the input terminal of the basic block D, the output terminal of the basic block D is connected an input terminal of the basic block an output terminal of the basic block G is connected to the input terminal of the basic block H, the output terminal of the basic block H is connected to the input terminal of the basic block E, the output terminal of the basic block E is connected to the input terminal of the basic block F, and the output terminal of the basic block F is connected to the input terminal of the basic block I. When the programming cell SwVA, the programming cell SwVD, the programming cell SwVG, the programming cell SwVH, the programming cell SwVE, the programming cell SwVF, and the programming cell SwVI are turned on, the power supply potential VDD is applied to the basic block A, the basic block D, the basic block E, the basic block F, the basic block the basic block H, and the basic block I. Then, all the programming cells except the above programming cells are off. As a result, as illustrated in FIG. 5, a path of a signal from the input terminal (IN) of a semiconductor device to the basic block A, the basic block D, the basic block the basic block H, the basic block E, the basic block F, and the basic block I is formed. Then, the third signal processing is performed in each of the above basic blocks, whereby a signal is output from the output terminal (OUT).

Note that the time required for performing a configuration process (switching of the programming cells is controlled to form a circuit) is small enough to be ignored, as long as a circuit configuration as illustrated in FIG. 3 is used, depending on the size of a matrix formed using the basic blocks and the programming cells. For example, the above time needed per basic blocks of one row is less than or equal to 100 nanoseconds. If a matrix formed using the basic blocks of three rows as illustrated FIG. 1 is used, the above time is less than 1 microsecond.

In one embodiment of the present invention, the supply of the power supply voltage to the basic block which does not contribute to the circuit configuration is stopped, so that power consumption of a semiconductor device can be reduced. In particular, in a semiconductor device having a channel length of less than or equal to 50 nm, the thickness of a gate insulating film is less than or equal to several nanometers, and leakage current flowing through the gate insulating film accounts for substantial amount of power consumption; therefore, the above structure is effective in decreasing power consumption.

In one embodiment of the present invention, when the connection between the basic blocks is controlled by a transistor with extremely low off-state current or extremely low leakage current, leakage current or off-state current which flows between the basic block to which the power supply voltage is applied and the basic block to which the power supply voltage is not applied can be reduced, and power consumption of a semiconductor device can be reduced.

Degradation of the gate insulating film in the programming cell having the above structure due to tunneling current can be reduced when compared to that in a conventional programming cell formed using the EEPROM; therefore, a semiconductor device in which the number of times of rewriting data can increase can be provided.

In the programming cell having the above structure, the operating voltage which is needed for writing of data is approximately determined by the operating voltage of the second transistor (Tr2). Accordingly, a semiconductor device in which the above operating voltage can be significantly reduced and power consumption can be suppressed as compared to the conventional programming cell formed using the EEPROM can be provided.

Unlike a programming cell formed using the SRAM, the programming cell having the above structure can hold a connection state to some extent even when the power supply voltage is not always supplied to the programming cell. In addition, data is held using a transistor with remarkably low off-state current. Therefore, a semiconductor device in which power consumption can be reduced can be provided.

Embodiment 2

In Embodiment 1, the example in which a given basic block can be connected to up to four adjacent basic blocks is described; however, in this embodiment, an example in which a given basic block is connected to eight adjacent basic blocks will be described.

Figure 6:
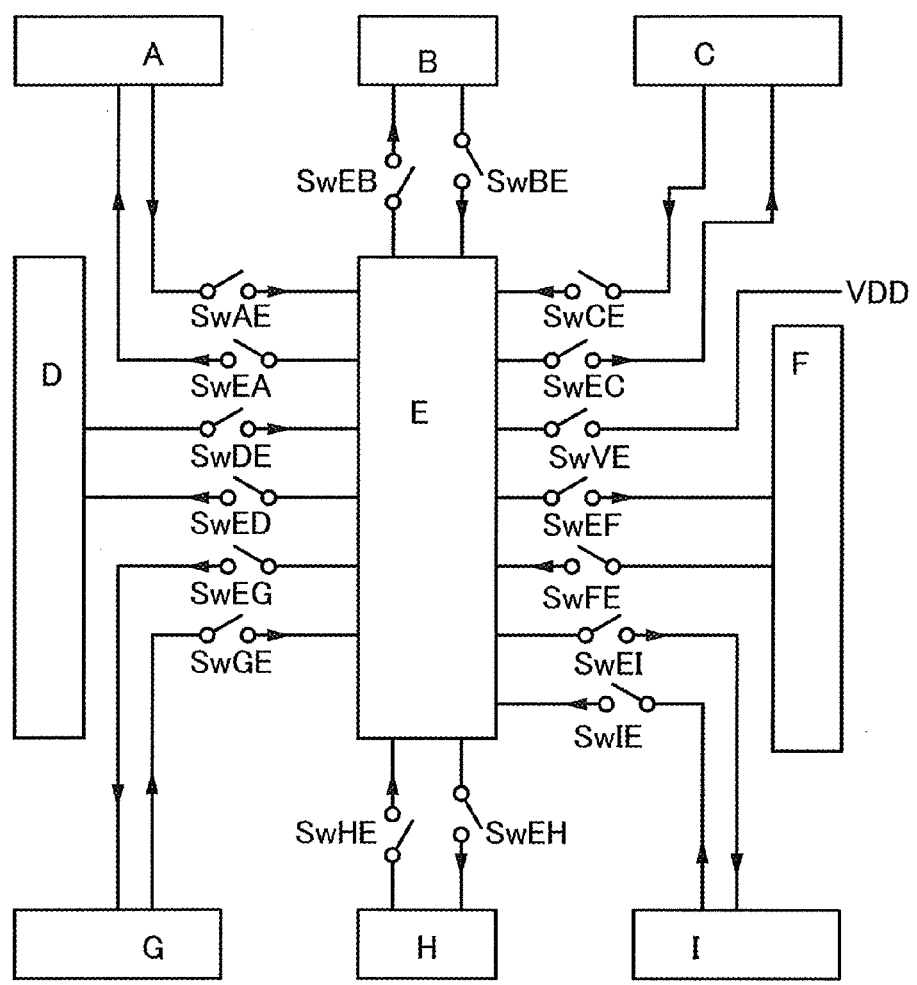
FIG. 6 is a diagram illustrating a structure of a semiconductor device.

In a manner similar to that of FIG. 1, a semiconductor device illustrated in FIG. 6 is provided with nine basic blocks A to I, programming cells which control connections between the basic blocks A to I, and programming cells which control the supply of the power supply potential VDD to each of the basic blocks A to I.

Unlike FIG. 1, in the semiconductor device illustrated in FIG. 6, the central basic block E can be connected to all the basic blocks except the basic block E, via programming cells SwAE to SwIE and programming cells SwEA to SwEI.

Note that in FIG. 6, only the programming cells SwAE to SwIE which control connections between the central basic block E and the other basic blocks, the programming cells SwEA to SwEI which control connections between the central basic block E and the other basic blocks, and the programming cell SwVE which controls the supply of the power supply potential VDD to the basic block E are illustrated. However, connections between the basic block A and the basic block B, between the basic block B and the basic block C, between the basic block C and the basic block F, between the basic block F and the basic block I, between the basic block A and the basic block D, between the basic block D and the basic block between the basic block G and the basic block H, and between the basic block H and the basic block I can be controlled by the programming cells in a manner similar to that of FIG. 1. In addition, the supply of the power supply potential VDD to the basic block A, the basic block B, the basic block C, the basic block D, the basic block F, the basic block the basic block H, and the basic block I can be controlled by the programming cells in a manner similar to that of FIG. 1.

Note that the structure described in Embodiment 1 can be used for the programming cells.

As illustrated in FIG. 6, the number of basic blocks which can be connected to a given basic block can be set by a designer, as appropriate.

This embodiment can be implemented by being combined as appropriate with the above embodiment.

Embodiment 3

A semiconductor device in which a large matrix is formed using basic blocks will be described using an example which is more generalized.

Figure 7:
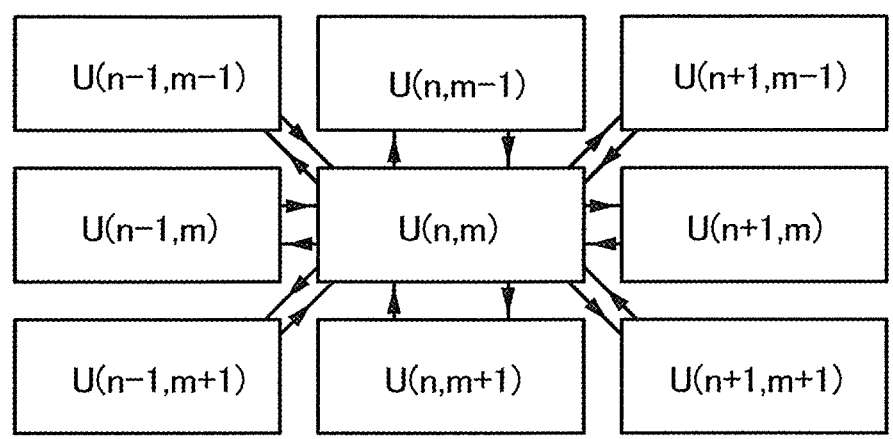
FIG. 7 is a diagram illustrating a structure of a semiconductor device.

In this embodiment, attention is paid on a basic block U(n, m) of the n-th row and the m-th column included in the semiconductor device. As illustrated in FIG. 7, around the basic block U(n, m), there are eight basic blocks: U(n−1, m−1); U(n, m−1); U(n+1, m−1); U(n−1, m); U(n+1, m); U(n−1, m+1); U(n, m+1); and U(n+1, m+1). The basic block U(n, m) is connected to these eight basic blocks via programming cells in order to transmit and receive signals.

Figure 8:
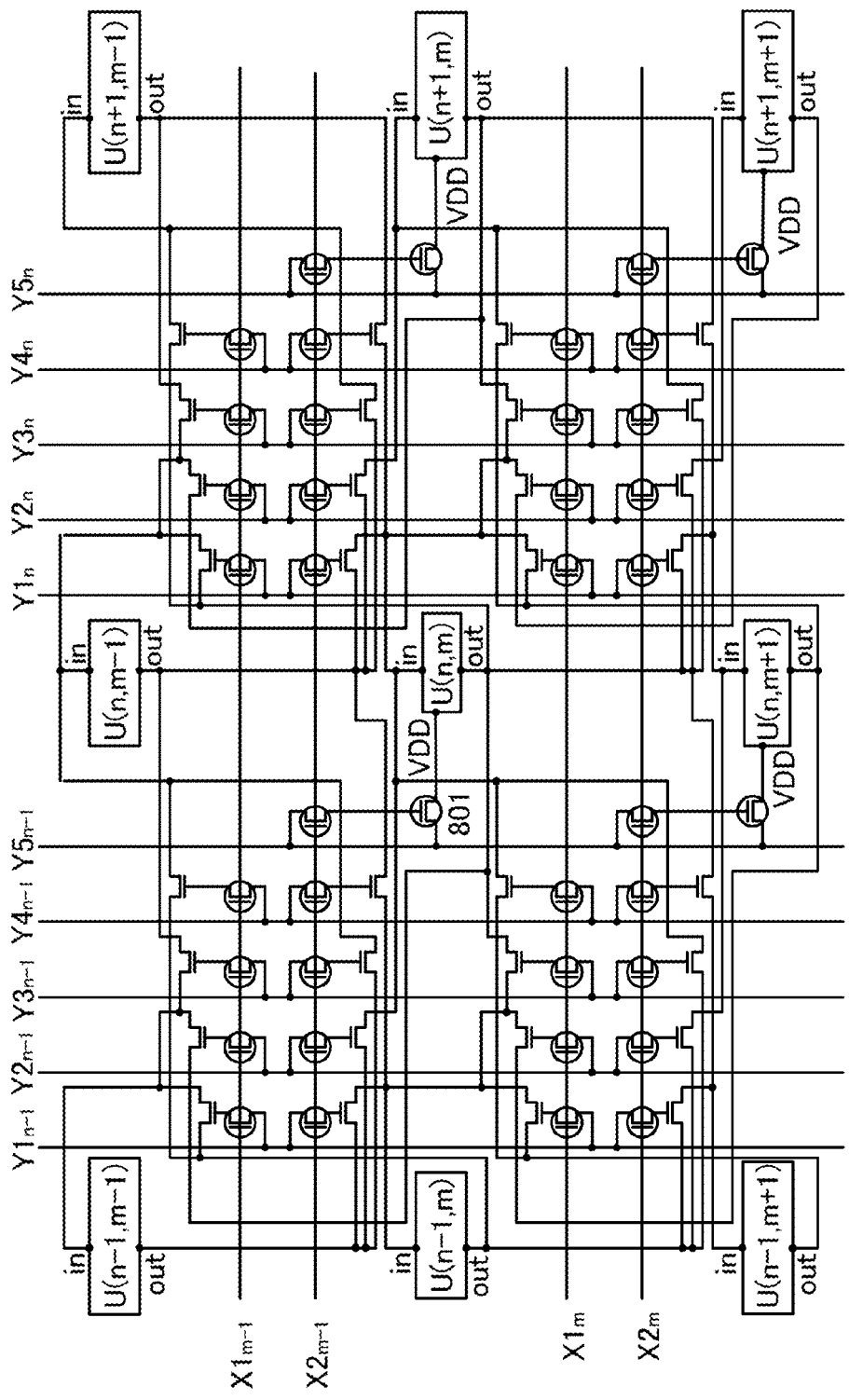
FIG. 8 is a diagram illustrating a structure of a semiconductor device.

In FIG. 8, an example of a specific structure of a programming cell for controlling connections between the basic blocks illustrated in FIG. 7 and a programming cell for controlling the supply of the power supply potential VDD to each basic block is illustrated.

Note that an example in which the programming cell illustrated in FIG. 2A is used is described in FIG. 8; however, any of the programming cells illustrated in FIGS. 2B and 2C may be used. The structure of the programming cell is not limited to the circuit configurations illustrated in FIGS. 2A to 2C. The structure of the programming cell may include at least a first transistor for controlling a connection between two nodes and a second transistor for controlling the supply of a potential to a gate electrode of the above first transistor and a channel formation region of the second transistor may include a semiconductor material such as an oxide semiconductor having a band gap which is approximately three times as large as that of silicon.

In FIG. 8, a transistor which is used for the programming cell and whose channel formation region includes a semiconductor material such as an oxide semiconductor is illustrated using a symbol in which a circle is added to a normal transistor symbol in order to be distinguished from another transistor.

The semiconductor device illustrated in FIG. 8 includes signal lines for controlling an operation of the programming cells as well as the above basic blocks.

Specifically, an example, in which five data signal lines Y1, Y2, Y3, Y4, and Y5 per one column and two scan signal lines X1 and X2 per one row in a matrix are used as signal lines, is illustrated in FIG. 8; however, a structure in which one scan signal line per one row and nine data signal lines per one column are used may be employed. When the number of scan signal lines is reduced, the time for performing a configuration process can be shortened.

Note that in FIG. 8, five data signal lines of the (n−1)-th column are $Y1_{n-1}$, $Y2_{n-1}$, $Y3_{n-1}$, $Y4_{n-1}$, and $Y5_{n-1}$, whereas five data signal lines of the n-th column are $Y1_n$, $Y2_n$, $Y3_n$, $Y4_n$, and $Y5_n$. In addition, two scan signal lines of the (m−1)-th row are $X1_{m-1}$ and $X2_{m-1}$, whereas two scan signal lines of the m-th row are $X1_m$ and $X2_m$.

In order to reduce the total number of signal lines, the number of scan signal lines and data signal lines may be set in accordance with the basic blocks which form a matrix. For example, as illustrated in FIG. 8, when five data signal lines per one column and two scan signal lines per one row are provided, approximately (2N+5M) signal lines are needed in total for the semiconductor device including the basic blocks of N rows and M columns. On the other hand, when nine data signal lines per one column and one scan signal line per one row are used, approximately (N+9M) signal lines are needed in total for the semiconductor device including the basic blocks of N rows and M columns. Accordingly, if a semiconductor device where the relation N<4M is satisfied is used, the adoption of the former structure rather than the latter structure can reduce the total number of signal lines. On the other hand, if a semiconductor device where N>4M is satisfied is used, the adoption of the latter structure rather than the former structure can reduce the total number of signal lines.

In the semiconductor device described in this embodiment, a power supply potential is supplied using the data signal line Y5. The data signal line Y5 ($Y5_1$, $Y5_2$, ..., $Y5_{n-1}$, $Y5_n$, ...) transmits a signal for controlling switching of a first transistor 801 included in each basic block to the first transistor 801 included in the programming cells for supplying a power supply potential. Then, in a manner similar to that of another data signal line and another scan signal line, a signal is not needed to transmit to the data signal line Y5 in a period in which the configuration process is not performed. Accordingly, in that period, a power supply potential can be supplied to each basic block from the data signal line Y5.

Note that in FIG. 8, the example in which only one input terminal and only one output terminal are provided for each basic block is described; however, a basic block including a plurality of input terminals or a plurality of output terminals may be used.

Next, an example of an operation of the semiconductor device illustrated in FIG. 8 is described. A timing chart of a signal input to each signal line of the semiconductor device illustrated in FIG. 8 is shown in FIG. 9A.

As illustrated in FIG. 9A, signals each having a pulse are sequentially applied to the scan signal lines $X1_{m-1}$, $X2_{m-1}$, $X1_m$, and $X2_m$ so as to have different timing. In FIG. 9A, only a potential of a signal applied to the scan signal line $X1_{m-1}$ is represented by a solid line, and a potential of a signal applied to the scan signal lines $X2_{m-1}$, $X1_m$, and $X2_m$ is represented by a dotted line. In FIG. 9A, the potential of a signal is kept to be negative in a period other than a period in which a positive potential pulse is applied. Accordingly, when a signal having a pulse is applied to each scan signal line, the second transistor whose gate electrode is connected to the scan signal line is turned on.

Then, in accordance with timing when a pulse is applied to each scan signal line, selection signals are applied to the data signal lines $Y1_{n-1}$, $Y2_{n-1}$, $Y3_{n-1}$, $Y4_{n-1}$, $Y5_{n-1}$, $Y1_n$, $Y2_n$, $Y3_n$, $Y4_n$, and $Y5_n$. The selection signal applied to each data signal line is input to a gate electrode of the first transistor provided at an intersection of the scan signal line and the data signal line via the second transistor which is turned on. Then, in accordance with a potential of this selection signal, switching of the above first transistor is controlled.

For example, in order to connect the basic blocks illustrated in FIG. 8 in order of U(n−1, m−1), U(n, m), U(n, m+1), U(n−1, m), U(n, m−1), and U(n+1, m), a pulse may be applied to each signal line in accordance with the timing chart illustrated in FIG. 9A.

Specifically, first, a pulse is applied to the data signal line $Y4_{n-1}$ in accordance with timing when a pulse is applied to the scan signal line $X1_{m-1}$. Then, the first transistor at an intersection of the scan signal line $X1_{m-1}$ and the data signal line $Y4_{n-1}$ is turned on. The first transistor is a switch which controls a connection between an output terminal of the basic block U(n−1, m) and an input terminal of the basic block U(n, m−1). Accordingly, when the above first transistor is turned on, a path of a signal from the basic block U(n−1, m) to the basic block U(n, m−1) is formed.

Next, pulses are applied to the data signal lines $Y2_{n-1}$, $Y5_{n-1}$, $Y2_n$, and $Y5_n$ in accordance with timing when a pulse is applied to the scan signal line $X2_{m-1}$; then, the first transistors at respective intersections are turned on. Of these, the first transistor at the intersection of the scan signal line $X2_{m-1}$ and the data signal line $Y2_{n-1}$ is a switch which controls a connection between an output terminal of the basic block U(n−1, m−1) and an input terminal of the basic block U(n, m). In addition, the first transistor at the intersection of the scan signal line $X2_{m-1}$ and the data signal line $Y5_{n-1}$ is a switch which controls the supply of a power supply potential to the basic block U(n, m), and the first transistor at the intersection of the scan signal line $X2_{m-1}$ and the data signal line $Y5_n$ is a switch which controls the supply of a power supply potential to the basic block U(n+1, m). Further, the first transistor at the intersection of the scan signal line $X2_{m-1}$ and the data signal line $Y2_n$ is a switch which controls a connection between an output terminal of the basic block U(n, m−1) and an input terminal of the basic block U(n+1, m). Accordingly, when the above first transistors are turned on, a path of a signal from the basic block U(n−1, m−1) to the basic block U(n, m) and a path of a signal from the basic block U(n, m−1) to the basic block U(n+1, m) are formed. Further, a power supply potential is supplied to the basic blocks U(n, m) and U(n+1, m).

Next, a pulse is applied to the data signal line $Y2_{n-1}$ in accordance with timing when a pulse is applied to the scan signal line $X1_m$. Then, the first transistor at an intersection of the scan signal line $X1_m$ and the data signal line $Y2_{n-1}$ is turned on. The first transistor is a switch which controls a connection between an output terminal of the basic block U(n, m+1) and an input terminal of the basic block U(n−1, m). Accordingly, when the above first transistor is turned on, a path of a signal from the basic block U(n, m+1) to the basic block U(n−1, m) is formed.

Next, pulses are applied to the data signal lines $Y5_{n-1}$ and $Y1_n$ in accordance with timing when a pulse is applied to the scan signal line $X2_m$; then, the first transistors at respective intersections are turned on. Of these, the first transistor at the intersection of the scan signal line $X2_m$ and the data signal line $Y1_n$ is a switch which controls a connection between an output terminal of the basic block U(n, m) and an input terminal of the basic block U(n, m+1). The first transistor at the intersection of the scan signal line $X2_m$ and the data signal line $Y5_{n-1}$ is a switch which controls the supply of a power supply potential to the basic block U(n, m+1). Accordingly, when the above first transistor is turned on, a path of a signal from the basic block U(n, m) to the basic block U(n, m+1) is formed and a supply path of a power supply potential to the basic block U(n, m+1) is formed.

When the above operations are performed, the path of a signal from the basic block U(n−1, m−1) to the basic block U(n, m), the path of a signal from the basic block U(n, m) to the basic block U(n, m+1), the path of a signal from the basic block U(n, m+1) to the basic block U(n−1, m), the path of a signal from the basic block U(n−1, m) to the basic block U(n, m−1), and the path of a signal from the basic block U(n, m−1) to the basic block U(n+1, m) are formed, and the supply paths of power supply potentials to the basic blocks U(n, m+1), U(n, m), and U(n+1, m) are formed.

Although not illustrated in the timing chart of FIG. 9A, supply paths of power supply potentials to the basic blocks U(n−1, m−1), U(n, m−1), and U(n−1, m) besides the basic blocks U(n, m+1), U(n, m), and U(n+1, m) are formed.

As described above, a connection between the basic blocks and the supply of a power supply potential are set by scanning of each scan signal line; therefore, as the number of scan signal lines increases, a longer time for setting is required. Note that the scan time per one scan signal line, namely, the time when a pulse is applied to the scan signal line, is less than or equal to 100 nanoseconds. Therefore, even when a semiconductor device includes 1000 scan signal lines, the time when all the scan signal lines are scanned is less than 1 millisecond.

As described above, after a connection between the basic blocks and the supply of a power supply potential are set, a power supply potential is supplied to the data signal line Y5 ($Y5_1$, $Y5_2$, ..., $Y5_{n-1}$, $Y5_n$, ...). A power supply potential is supplied from the above data signal line to the basic block provided with the supply path of a power supply potential via the first transistor; therefore, an arithmetic process can be performed.

Next, an operation of the semiconductor device illustrated in FIG. 8 will be described using another example. In FIG. 9B, a timing chart of a signal input to each signal line of the semiconductor device illustrated in FIG. 8 is shown.

As illustrated in FIG. 9B, signals each having a pulse are sequentially supplied to the scan signal lines $X1_{m-1}$, $X2_{m-1}$, $X1_m$, and $X2_m$ so as to have different timing. Also in FIG. 9B, only a potential of a signal applied to the scan signal line $X1_{m-1}$ is illustrated by a solid line, and potentials of signals applied to the scan signal lines $X2_{m-1}$, $X1_m$, and $X2_m$ are illustrated by dotted lines. In FIG. 9B, the potential of a signal is also kept to be negative in a period other than a period in which a positive potential pulse is applied. Accordingly, when a signal having a pulse is applied to each scan signal line, the second transistor whose gate electrode is connected to the scan signal line is turned on.

In FIG. 9B, a pulse is not applied to a data signal line in a period in which a pulse is applied to the scan signal line $X1_{m-1}$. Next, a pulse is applied to the data signal lines $Y5_{n-1}$, $Y3_n$, and $Y4_n$ in accordance with timing when a pulse is applied to the scan signal line $X2_{m-1}$; then, the first transistors at respective intersections are turned on.

Of these, the first transistor at the intersection of the scan signal line $X2_{m-1}$ and the data signal line $Y5_{n-1}$ is a switch which controls the supply of a power supply potential to the basic block U(n, m). Further, the first transistor at the intersection of the scan signal line $X2_{m-1}$ and the data signal line $Y3_n$ is a switch which connects the output terminal of the basic block U(n, m−1) and an input terminal of the basic block U(n+1, m−1). The first transistor at the intersection of the scan signal line $X2_{m-1}$ and the data signal line $Y4_n$ is a switch which connects an output terminal of the basic block U(n+1, m−1) and the input terminal of the basic block U(n, m). When the above first transistors are turned on, a path of a signal from the basic block U(n, m−1) to the basic block U(n+1, m−1) and a path of a signal from the basic block U(n+1, m−1) to the basic block U(n, m) are formed, and a supply path of a power supply potential to the basic block U(n, m) is formed.

Next, a pulse is applied to the data signal line $Y3_{n-1}$ in accordance with timing when a pulse is applied to the scan signal line $X1_m$; then, the first transistor is turned on at an intersection of the scan signal line $X1_m$ and the data signal line $Y3_{n-1}$. The first transistor is a switch which controls a connection between the output terminal of the basic block U(n, m) and the input terminal of the basic block U(n−1, m). Accordingly, when the above first transistor is turned on, a path of a signal from the basic block U(n, m) to the basic block U(n−1, m) is formed.

Next, a pulse is applied to the data signal line $Y1_{n-1}$ in accordance with timing when a pulse is applied to the scan signal line $X2_m$; then, the first transistor at the intersection of the scan signal line $X2_m$ and the data signal line $Y1_{n-1}$ is turned on. The first transistor at the intersection is a switch which controls a connection of the output terminal of the basic block U(n−1, m) and an input terminal of the basic block U(n−1, m+1). As described above, a path of a signal from the basic block U(n−1, m) to the basic block U(n−1, m+1) can be formed.

When the above operations are performed, a path of a signal from the basic block U(n, m−1) to the basic blocks U(n+1, m−1), U(n, m), U(n−1, m), and U(n−1, m+1) in that order is formed, and the supply path of a power supply potential to the basic block U(n, m) is formed. Although not illustrated in the timing chart of FIG. 9B, supply paths of power supply potentials to the basic blocks U(n, m−1), U(n+1, m−1), and U(n−1, m) besides the basic block U(n, m) are formed.

This embodiment can be implemented by being combined as appropriate with any of the above embodiments.

Embodiment 4

In this embodiment, a method for manufacturing a second transistor which is used for a programming cell and which is formed using an oxide semiconductor will be described. Note that in this embodiment, the method for manufacturing the second transistor using an oxide semiconductor is described taking the programming cell in FIG. 2B as an example; however, a programming cell having another circuit configuration can also be formed using the manufacturing method described in this embodiment.

A first transistor and a third transistor can be formed using a normal CMOS process in which germanium, silicon, silicon germanium, single crystal silicon carbide, or the like is used. Also, the first transistor and the third transistor may be formed using a semiconductor thin film or a bulk semiconductor substrate. In this embodiment, the case where the second transistor formed using an oxide semiconductor is formed over the first transistor and the third transistor which are formed using an SOI (Silicon on Insulator) substrate is given as an example, and a manufacturing method thereof is described.

First, as illustrated in FIG. 10A, a first transistor 501 and a third transistor 502 are formed using an SOI substrate. Specifically, the first transistor 501 is an n-channel transistor formed using a single crystal silicon film 503 over a substrate 500 having an insulating surface, and the third transistor 502 is a p-channel transistor formed using a single crystal silicon film 504 over the substrate 500 having an insulating surface. A gate insulating film of each of the first transistor 501 and the third transistor 502 is 10 nm to 100 nm, inclusive, and a channel length of each of the first transistor 501 and the third transistor 502 is 100 nm to 500 nm, inclusive. The channel length of the first transistor 501 may be different from that of the third transistor 502.

Next, a second transistor is formed using an oxide semiconductor over the first transistor 501 and the third transistor 502.

First, as illustrated in FIG. 10A, an insulating film 505, an insulating film 506, and an insulating film 507 are sequentially formed so as to cover the first transistor 501 and the third transistor 502. Note that in this embodiment, the example in which the first transistor 501 and the third transistor 502 are covered with three films, the insulating film 505, the insulating film 506, and the insulating film 507 is described; however, the number of insulating films provided between the first transistor 501 and the second transistor and between the third transistor 502 and the second transistor is not necessarily three, and one insulating film, two insulating films, or four or more insulating films may be formed.

The insulating film 505, the insulating film 506, and the insulating film 507 are formed using materials which can withstand a temperature of heat treatment in a later manufacturing step. Specifically, it is preferable to use silicon oxide, silicon nitride, silicon nitride oxide, silicon oxynitride, aluminum nitride, aluminum oxide, or the like for the insulating film 505, the insulating film 506, and the insulating film 507. Also, in this specification, an oxynitride compound denotes a material containing a higher quantity of oxygen than that of nitrogen, and a nitride oxide compound denotes a material containing a higher quantity of nitrogen than that of oxygen.

A surface of the insulating film 507 may be planarized by a chemical mechanical polishing (CMP) method or the like.

Next, as illustrated in FIG. 10B, a gate electrode 601 and electrodes 602 are formed over the insulating film 507.

The gate electrode 601 and the electrodes 602 can be formed to have a single-layer structure or a stacked structure using one or more conductive films using a metal material such as molybdenum, titanium, chromium, tantalum, tungsten, neodymium, or scandium; an alloy material which contains any of these metal materials as its main component; or a nitride which contains any of these metals. Note that aluminum or copper can also be used as such metal materials if aluminum or copper can withstand a temperature of heat treatment performed in a later process. Aluminum or copper is preferably combined with a refractory metal material so as to prevent a heat resistance problem and a corrosion problem. As the refractory metal material, molybdenum, titanium, chromium, tantalum, tungsten, neodymium, scandium, or the like can be used.

For example, as a two-layer structure of the gate electrode 601 and the electrodes 602, the following structures are preferable: a two-layer structure in which a molybdenum film is stacked over an aluminum film, a two-layer structure in which a molybdenum film is stacked over a copper film, a two-layer structure in which a titanium nitride film or a tantalum nitride film is stacked over a copper film, and a two-layer structure in which a titanium nitride film and a molybdenum film are stacked. As a three-layer structure of the gate electrode 601 and the electrodes 602, the following structure is preferable: a stacked structure containing an aluminum film, an alloy film of aluminum and silicon, an alloy film of aluminum and titanium, or an alloy film of aluminum and neodymium in a middle layer and any of a tungsten film, a tungsten nitride film, a titanium nitride film, and a titanium film in a top layer and a bottom layer.

Further, a light-transmitting oxide conductive film of indium oxide, an alloy of indium oxide and tin oxide ($In_2O_3$—$SnO_2$, abbreviated to ITO), an alloy of indium oxide and zinc oxide, zinc oxide, zinc aluminum oxide, zinc aluminum oxynitride, zinc gallium oxide, or the like can be used as the gate electrode 601 and the electrodes 602.

The thickness of each of the gate electrode 601 and the electrodes 602 is in the range of 10 nm to 400 nm, preferably 100 nm to 200 nm. In this embodiment, after the conductive film for the gate electrode is formed to have a thickness of 150 nm formed by a sputtering method using a tungsten target, the conductive film is processed (patterned) into a desired shape by etching, whereby the gate electrode 601 and the electrodes 602 are formed. Note that when end portions of the formed gate electrode are tapered, coverage with a gate insulating film stacked thereover is improved, which is preferable. Note that a resist mask may be formed by an inkjet method. Formation of the resist mask by an inkjet method needs no photomask; thus, manufacturing cost can be reduced.

Next, as illustrated in FIG. 10C, a gate insulating film 603 is formed over the gate electrode 601 and the electrodes 602. The gate insulating film 603 is formed using a film having a single layer or a stacked layer which includes a silicon oxide film, a silicon nitride film, a silicon oxynitride film, a silicon nitride oxide film, an aluminum oxide film, an aluminum nitride film, an aluminum oxynitride film, an aluminum nitride oxide film, a hafnium oxide film, or a tantalum oxide film by a plasma enhanced CVD method, a sputtering method, or the like. It is preferable that the gate insulating film 603 include impurities such as moisture or hydrogen as little as possible. In the case where a silicon oxide film is formed by a sputtering method, a silicon target or a quartz target is used as a target and oxygen or a mixed gas of oxygen and argon is used as a sputtering gas.

The oxide semiconductor that is made to be an i-type oxide semiconductor or a substantially i-type oxide semiconductor (highly-purified oxide semiconductor) by removal of impurities is extremely sensitive to an interface state and an interface electric charge; thus, characteristics of an interface between the highly-purified oxide semiconductor and the gate insulating film 603 are important. Therefore, the gate insulating film (GI) that is in contact with the highly-purified oxide semiconductor needs to be of high quality.

For example, a high-density plasma enhanced CVD using a microwave (frequency: 2.45 GHz) is preferably used, in which case an insulating film which is dense, has high withstand voltage, and is of high quality can be formed. The highly-purified oxide semiconductor and the high-quality gate insulating film are in close contact with each other, whereby density of interface states can be reduced and favorable interface characteristics can be obtained.

Needless to say, a different deposition method such as a sputtering method or a plasma enhanced CVD method can be used as long as a high-quality insulating film can be formed as a gate insulating film. In addition, any insulating film can be used as long as film quality and characteristics of an interface with an oxide semiconductor are modified by heat treatment performed after deposition. In any case, any insulating film that has a reduced interface state density of an interface between a gate insulating film and the oxide semiconductor and can form a favorable interface as well as having a favorable film quality as the gate insulating film can be used.

The gate insulating film 603 may have a structure in which an insulating film formed using a material having a high barrier property and an insulating film having low proportion of nitrogen such as a silicon oxide film or a silicon oxynitride film are stacked. In that case, the insulating film such as a silicon oxide film or a silicon oxynitride film is formed between the insulating film having a high barrier property and the oxide semiconductor film. As the insulating film having a high barrier property, a silicon nitride film, a silicon nitride oxide film, an aluminum nitride film, an aluminum nitride oxide film, and the like can be given, for example. The insulating film having a high barrier property is used, so that impurities in an atmosphere, such as moisture or hydrogen, or impurities included in the substrate, such as an alkali metal or a heavy metal, can be prevented from entering the oxide semiconductor film, the gate insulating film 603, or the interface between the oxide semiconductor film and another insulating film and the vicinity thereof. In addition, the insulating film having low proportion of nitrogen such as a silicon oxide film or a silicon oxynitride film is formed so as to be in contact with the oxide semiconductor film, so that the insulating film having a high barrier property can be prevented from being in contact with the oxide semiconductor film directly.

For example, a stacked-layer film with a thickness of 100 nm may be formed as the gate insulating film 603 as follows: a silicon nitride film ($SiN_y$ (y>0)) with a thickness of 50 nm to 200 nm, inclusive is formed by a sputtering method as a first gate insulating film, and a silicon oxide film ($SiO_x$ (x>0)) with a thickness of 5 nm to 300 nm, inclusive is stacked over the first gate insulating film as a second gate insulating film. The thickness of the gate insulating film 603 may be set as appropriate depending on characteristics needed for a transistor, and may be approximately 350 nm to 400 nm.

In this embodiment, the gate insulating film 603 having a structure in which a silicon oxide film having a thickness of 100 nm formed by a sputtering method is stacked over a silicon nitride film having a thickness of 50 nm formed by a sputtering method is formed.

Note that the gate insulating film is in contact with the oxide semiconductor. When hydrogen enters the oxide semiconductor, characteristics of the transistor are adversely affected; therefore, it is preferable that the gate insulating film do not contain hydrogen, hydroxyl, and moisture. In order that the gate insulating film 603 contains as little hydrogen, hydroxyl, and moisture as possible, it is preferable that an impurity adsorbed on the substrate 500, such as moisture or hydrogen, be eliminated and removed by preheating the substrate 500, over which the gate electrode 601 and the electrodes 602 are formed, in a preheating chamber of a sputtering apparatus, as a pretreatment for film formation. The temperature for the preheating is 100° C. to 400° C., inclusive, preferably, 150° C. to 300° C., inclusive. As an exhaustion unit provided in the preheating chamber, a cryopump is preferable. Note that this preheating treatment can be omitted.

Next, over the gate insulating film 603, an oxide semiconductor film having a thickness of 2 nm to 200 nm, inclusive, preferably 3 nm to 50 nm, inclusive, more preferably 3 nm to 20 nm, inclusive is formed. The oxide semiconductor film is formed by a sputtering method using an oxide semiconductor target. Moreover, the oxide semiconductor film can be formed by a sputtering method under a rare gas (e.g., argon) atmosphere, an oxygen atmosphere, or a mixed atmosphere of a rare gas (e.g., argon) and oxygen.

Note that before the oxide semiconductor film is formed by a sputtering method, dust attached to a surface of the gate insulating film 603 is preferably removed by reverse sputtering in which an argon gas is introduced and plasma is generated. The reverse sputtering refers to a method in which, without application of the voltage to a target side, an RF power source is used for application of the voltage to a substrate side under an argon atmosphere to generate plasma in the vicinity of the substrate to modify a surface. Note that instead of an argon atmosphere, a nitrogen atmosphere, a helium atmosphere, or the like may be used. Alternatively, an argon atmosphere to which oxygen, nitrous oxide, or the like is added may be used. Further alternatively, an argon atmosphere to which chlorine, carbon tetrafluoride, or the like is added may be used.

As described above, as the oxide semiconductor film, the following oxide semiconductors can also be used: a quaternary metal oxide such as an In—Sn—Ga—Zn—O-based oxide semiconductor; a ternary metal oxide such as an In—Ga—Zn—O-based oxide semiconductor, an In—Sn—Zn—O-based oxide semiconductor, an In—Al—Zn—O-based oxide semiconductor, a Sn—Ga—Zn—O-based oxide semiconductor, an Al—Ga—Zn—O-based oxide semiconductor, and a Sn—Al—Zn—O-based oxide semiconductor; a binary metal oxide such as an In—Zn—O-based oxide semiconductor, a Sn—Zn—O-based oxide semiconductor, an Al—Zn—O-based oxide semiconductor, a Zn—Mg—O-based oxide semiconductor, a Sn—Mg—O-based oxide semiconductor, an In—Mg—O-based oxide semiconductor, an In—Ga—O-based oxide semiconductor; an In—O-based oxide semiconductor; a Sn—O-based oxide semiconductor; and a Zn—O-based oxide semiconductor. The above oxide semiconductor may include silicon.

Alternatively, oxide semiconductors can be represented by the chemical formula, $InMO_3(ZnO)_m$ (m>0). Here, M represents one or more metal elements selected from Ga, Al, Mn, and Co.

In this embodiment, as the oxide semiconductor film, an In—Ga—Zn—O-based oxide semiconductor thin film with a thickness of 30 nm, which is obtained by a sputtering method using a target including indium (In), gallium (Ga), and zinc (Zn), is used. As the above target, for example, a target having a composition ratio of metals, In:Ga:Zn=1:1:0.5, In:Ga:Zn=1:1:1, or In:Ga:Zn=1:1:2 can be used. The target may contain $SiO_2$ at 2 wt % to 10 wt %, inclusive. The filling rate of the target including In, Ga, and Zn is 90% to 100%, inclusive, preferably 95% to 99.9%, inclusive. With the use of the target with high filling rate, a dense oxide semiconductor film is formed.

In this embodiment, the oxide semiconductor film is formed over the substrate 500 as follows: the substrate is held in the chamber with pressure reduced, residual moisture in the chamber is removed, a sputtering gas from which hydrogen and moisture are removed is introduced, and the above target is used. At that time, the substrate may be heated at 100° C. to 600° C., inclusive, preferably 200° C. to 400° C., inclusive. Film formation is performed while the substrate is heated, whereby the concentration of an impurity contained in the oxide semiconductor film formed can be reduced. In addition, damage due to sputtering can be reduced. In order to remove residual moisture in the treatment chamber, an entrapment vacuum pump is preferably used. For example, a cryopump, an ion pump, or a titanium sublimation pump is preferably used. The evacuation unit may be a turbo pump provided with a cold trap. In the deposition chamber which is evacuated with the cryopump, for example, a hydrogen atom, a compound containing a hydrogen atom, such as water ($H_2O$), (more preferably, also a compound containing a carbon atom), and the like are removed, whereby the concentration of an impurity contained in the oxide semiconductor film formed in the deposition chamber can be reduced.

As one example of the deposition conditions, the distance between the substrate and the target is 100 mm, the pressure is 0.6 Pa, the direct-current (DC) power is 0.5 kW, and the atmosphere is an oxygen atmosphere (the proportion of the oxygen flow rate is 100%). Note that a pulsed direct-current (DC) power supply is preferable because dust generated in deposition can be reduced and the film thickness can be made uniform.

In order that the oxide semiconductor film contains as little hydrogen, hydroxyl, and moisture as possible, it is preferable that an impurity adsorbed on the substrate 500, such as moisture or hydrogen, be eliminated and removed by preheating the substrate 500, on which the process up to and including the step of forming the gate insulating film 603 is already performed, in a preheating chamber of a sputtering apparatus, as a pretreatment for film formation. The temperature for the preheating is 100° C. to 400° C., inclusive, preferably, 150° C. to 300° C., inclusive. As an exhaustion unit provided in the preheating chamber, a cryopump is preferable. Note that this preheating treatment can be omitted. Further, this preheating may be similarly performed on the substrate 500 on which the process up to and including the step of forming a source electrode 608, a drain electrode 609, and wirings 610 to 613 is already performed, before the formation of an insulating film 614.

Next, as illustrated in FIG. 10C, the oxide semiconductor film is processed (patterned) into a desired shape by etching or the like, whereby an island-shaped oxide semiconductor film 605 is formed over the gate insulating film 603 to overlap with the gate electrode 601.

A resist mask for forming the island-shaped oxide semiconductor film 605 may be formed by an inkjet method. Formation of the resist mask by an inkjet method needs no photomask; thus, manufacturing cost can be reduced.

Note that as the etching of the island-shaped oxide semiconductor film 605, dry etching, wet etching, or both of them may be employed. As an etching gas for dry etching, a gas containing chlorine (chlorine-based gas such as chlorine ($Cl_2$), boron trichloride ($BCl_3$), silicon tetrachloride ($SiCl_4$), or carbon tetrachloride ($CCl_4$)) is preferably used.

Alternatively, a gas containing fluorine (a fluorine-based gas such as carbon tetrafluoride ($CF_4$), sulfur hexafluoride ($SF_6$), nitrogen trifluoride ($NF_3$), or trifluoromethane ($CHF_3$)), hydrogen bromide (HBr), oxygen ($O_2$), any of these gases to which a rare gas such as helium (He) or argon (Ar) is added, or the like can be used.

As the dry etching method, a parallel plate RIE (reactive ion etching) method or an ICP (inductively coupled plasma) etching method can be used. In order to etch the film into a desired shape, the etching condition (the amount of electric power applied to a coil-shaped electrode, the amount of electric power applied to an electrode on a substrate side, the temperature of the electrode on the substrate side, or the like) is adjusted as appropriate.

As an etchant used for wet etching, a mixed solution of phosphoric acid, acetic acid, and nitric acid, or the like can be used. Alternatively, ITO-07N (produced by KANTO CHEMICAL CO., INC.) may be used. The etchant after the wet etching is removed together with the etched materials by cleaning. The waste liquid including the etchant and the material etched off may be purified and the material may be reused. When a material such as indium contained in the oxide semiconductor film is collected from the waste liquid after the etching and reused, the resources can be efficiently used and cost can be reduced.

Note that it is preferable that reverse sputtering be performed before the formation of a conductive film in a subsequent step so that a resist residue or the like that is attached to surfaces of the island-shaped oxide semiconductor film 605 and the gate insulating film 603 is removed.

Note that it is found that the oxide semiconductor film formed by sputtering or the like includes large amount of impurities such as moisture or hydrogen. Moisture and hydrogen easily form a donor level and thus serve as impurities in the oxide semiconductor. Thus, in one embodiment of the present invention, in order to reduce an impurity such as moisture or hydrogen in the oxide semiconductor film, heat treatment is performed on the oxide semiconductor film 605 under an atmosphere of nitrogen, oxygen, ultra-dry air (air in which a water content is less than or equal to 20 ppm, preferably less than or equal to 1 ppm, more preferably less than or equal to 10 ppb), or a rare gas (argon, helium, or the like).

When heat treatment is performed on the oxide semiconductor film 605, moisture or hydrogen in the oxide semiconductor film 605 can be reduced. Specifically, heat treatment may be performed at 300° C. to 700° C., inclusive, preferably 300° C. to 500° C., inclusive. For example, heat treatment may be performed at 500° C. for approximately three minutes to six minutes, inclusive. When an RTA method is used for the heat treatment, dehydration or dehydrogenation can be performed in a short time; therefore, treatment can be performed even at a temperature higher than the strain point of a glass substrate.

In this embodiment, an electrical furnace that is one of heat treatment apparatuses is used.

Note that a heat treatment apparatus is not limited to an electrical furnace, and may include a device for heating an object to be processed by heat conduction or heat radiation from a heating element such as a resistance heating element. For example, an RTA (rapid thermal anneal) apparatus such as a GRTA (gas rapid thermal anneal) apparatus or an LRTA (lamp rapid thermal anneal) apparatus can be used. An LRTA apparatus is an apparatus for heating an object to be processed by radiation of light (an electromagnetic wave) emitted from a lamp such as a halogen lamp, a metal halide lamp, a xenon arc lamp, a carbon arc lamp, a high pressure sodium lamp, or a high pressure mercury lamp. A GRTA apparatus is an apparatus for heat treatment using a high-temperature gas. As the gas, an inert gas which does not react with an object to be processed by heat treatment, such as nitrogen or a rare gas such as argon is used.

Note that in the heat treatment, it is preferable that moisture, hydrogen, and the like be not contained in nitrogen or a rare gas such as helium, neon, or argon. It is preferable that the purity of nitrogen or the rare gas such as helium, neon, or argon which is introduced into a heat treatment apparatus be set to be higher than or equal to 6N (99.9999%), preferably higher than or equal to 7N (99.99999%) (that is, the impurity concentration is lower than or equal to 1 ppm, preferably lower than or equal to 0.1 ppm).

Through the above steps, the hydrogen concentration in the oxide semiconductor film 605 can be reduced and the oxide semiconductor film 605 can be highly purified. Thus, the oxide semiconductor film can be stabilized. In addition, heat treatment at a temperature lower than or equal to the glass transition temperature makes it possible to form an oxide semiconductor film with a wide band gap in which carrier density is extremely low. Therefore, a transistor can be manufactured using a large-sized substrate, so that mass productivity can be increased. In addition, by using the oxide semiconductor film in which the hydrogen concentration is reduced and purity is improved, it is possible to manufacture a transistor with high withstand voltage and a high on-off ratio. The above heat treatment can be performed at any time after the oxide semiconductor film is formed.

When the oxide semiconductor film is heated, plate-like crystals are formed on the surface thereof depending on a material and heat condition of the oxide semiconductor film in some cases. The plate-like crystals are preferably single crystal bodies which are c-axis-aligned in a direction substantially perpendicular to a surface of the oxide semiconductor film. Even if the plate-like crystals are not single crystal bodies, each crystal is preferably a polycrystalline body which is c-axis-aligned in a direction substantially perpendicular to the surface of the oxide semiconductor film. Further, it is preferable that the polycrystalline bodies be c-axis-aligned and that the a-b planes of crystals correspond, or the a-axis or the b-axis of the crystals be aligned with each other. Note that in the case where a surface of a base of the oxide semiconductor film is uneven, each plate-like crystal is a polycrystal. Therefore, the surface of the base is preferably as even as possible.

Next, the insulating film 505, the insulating film 506, the insulating film 507, and the gate insulating film 603 are partly etched, whereby contact holes are formed, the contact holes reaching a pair of impurity regions 606 included in the first transistor 501, a pair of impurity regions 607 included in the third transistor 502, a gate electrode 510 included in the first transistor 501, and a gate electrode 511 included in the third transistor 502.

Note that one of the pair of impurity regions 606 included in the first transistor 501 functions as a source electrode and the other thereof functions as a drain electrode. In addition, one of the pair of impurity regions 607 included in the third transistor 502 functions as a source electrode and the other thereof functions as a drain electrode.

Then, a conductive film to be used for a source electrode and a drain electrode (including a wiring formed using the same layer as the source electrode and the drain electrode) is formed by a sputtering method or a vacuum deposition method so as to cover the oxide semiconductor film 605, and then the conductive film is patterned by etching or the like, whereby the source electrode 608, the drain electrode 609, and the wirings 610 to 613 are formed as illustrated in FIG. 11A.

Note that the source electrode 608 and the drain electrode 609 are in contact with the oxide semiconductor film 605. The wiring 610 is in contact with one of the pair of impurity regions 606. The wiring 611 is in contact with the other of the pair of impurity regions 606 and one of the pair of impurity regions 607. The wiring 612 is in contact with the gate electrode 510 and one of the electrodes 602. In addition, the wiring 613 is in contact with the gate electrode 511 and another one of the electrodes 602.

As a material of the conductive film to form the source electrode 608, the drain electrode 609, the wirings 610 to 613 (including another wiring formed in the same layer as the source electrode 608, the drain electrode 609, and the wirings 610 to 613), there are an element selected from Al, Cr, Cu, Ta, Ti, Mo, and W; an alloy including any of these elements as a component; an alloy film including any of these elements in combination; and the like. A structure in which a refractory metal film of Cr, Ta, Ti, Mo, W, or the like is stacked on a lower side and/or an upper side of a metal film of Al, Cu, or the like may be used. When an aluminum material to which an element for preventing generation of hillocks and whiskers in an aluminum film, such as Si, Ti, Ta, W, Mo, Cr, Nd, Sc, or Y, is added is used, heat resistance can be increased.

The conductive film may have a single-layer structure or a stacked structure of two or more layers. For example, a single-layer structure of an aluminum film including silicon, a two-layer structure in which a titanium film is stacked over an aluminum film, a three-layer structure in which a titanium film, an aluminum film, and a titanium film are stacked in that order, and the like can be given.

The conductive film to be the source electrode 608, the drain electrode 609, and the wirings 610 to 613 (including another wiring formed in the same layer as the source electrode 608, the drain electrode 609, and the wirings 610 to 613) may be formed using a conductive metal oxide. As the conductive metal oxide, indium oxide ($In_2O_3$), tin oxide ($SnO_2$), zinc oxide (ZnO), an alloy of indium oxide and tin oxide, an alloy of indium oxide and zinc oxide ($In_2O_3$—ZnO), or any of the metal oxide materials including silicon or silicon oxide can be used.

In the case where heat treatment is performed after formation of the conductive film, the conductive film preferably has enough heat resistance to withstand the heat treatment.

Note that materials and etching conditions are adjusted as appropriate so that the oxide semiconductor film 605 is not removed as much as possible in etching of the conductive film. Depending on etching conditions, an exposed portion of the island-shaped oxide semiconductor film 605 may be partly etched, so that a groove (a recessed portion) is formed in some cases.

In this embodiment, a titanium film is used for the conductive film. Therefore, wet etching can be selectively performed on the conductive film using a solution (ammonia hydrogen peroxide mixture) containing ammonia and hydrogen peroxide water; however, the oxide semiconductor film 605 is partly etched in some cases. In addition, as the ammonia hydrogen peroxide mixture, specifically, a solution in which hydrogen peroxide water of 31 wt %, ammonia water of 28 wt %, and water are mixed at a volume ratio of 5:2:2 is used. Alternatively, dry etching may be performed on the conductive film using a gas containing chlorine ($Cl_2$), boron trichloride ($BCl_3$), or the like.

In order to reduce the number of photomasks and steps in a photolithography step, etching may be performed with the use of a resist mask formed using a multi-tone mask which is a light-exposure mask through which light is transmitted so as to have a plurality of intensities. A resist mask formed with the use of a multi-tone mask has a plurality of thicknesses and further can be changed in shape by etching; therefore, the resist mask can be used in a plurality of etching steps for processing into different patterns. Therefore, a resist mask corresponding to at least two kinds or more of different patterns can be formed by one multi-tone mask. Thus, the number of light-exposure masks can be reduced and the number of corresponding photolithography steps can be also reduced, whereby simplification of a process can be realized.

Next, plasma treatment is performed thereon, using a gas such as $N_2O$, $N_2$, or Ar. By the plasma treatment, water or the like which is adsorbed on an exposed surface of the oxide semiconductor film is removed. Plasma treatment may be performed using a mixed gas of oxygen and argon as well.

After the plasma treatment, as illustrated in FIG. 11B, the insulating film 614 is formed so as to cover the source electrode 608, the drain electrode 609, the wirings 610 to 613, and the oxide semiconductor film 605. The insulating film 614 preferably includes impurities such as moisture or hydrogen as little as possible, and the insulating film 614 may be formed using a single-layer insulating film or a plurality of insulating films stacked. When hydrogen is contained in the oxide insulating film 614, entry of the hydrogen to the oxide semiconductor film, or extraction of oxygen in the oxide semiconductor film by hydrogen may occur, thereby causing the backchannel portion of the oxide semiconductor film to have lower resistance (to be n-type), so that a parasitic channel may be formed. Therefore, it is preferable that a deposition method in which hydrogen is not used is employed in order to form the insulating film 614 containing as little hydrogen as possible. A material having a high barrier property is preferably used for the above insulating film 614. For example, as the insulating film having a high barrier property, a silicon nitride film, a silicon nitride oxide film, an aluminum nitride film, an aluminum nitride oxide film, or the like can be used. When a plurality of insulating films stacked is used, an insulating film having lower proportion of nitrogen, such as a silicon oxide film or a silicon oxynitride film, is formed on the side closer to the oxide semiconductor film 605 than the above insulating film having a high barrier property. Then, the insulating film having a high barrier property is formed so as to overlap with the source electrode 608, the drain electrode 609, and the oxide semiconductor film 605 with the insulating film having lower proportion of nitrogen between the insulating film having a barrier property and the source electrode 608, the drain electrode 609, and the oxide semiconductor film 605. When the insulating film having a high barrier property is used, the impurities such as moisture or hydrogen can be prevented from entering the oxide semiconductor film 605, the gate insulating film 603, or the interface between the oxide semiconductor film 605 and another insulating film and the vicinity thereof. In addition, the insulating film having lower proportion of nitrogen such as a silicon oxide film or a silicon oxynitride film is formed so as to be in contact with the oxide semiconductor film 605, whereby the insulating film formed using a material having a high barrier property can be prevented from being in contact with the oxide semiconductor film 605 directly.

In this embodiment, the insulating film 614 having a structure in which a silicon nitride film having a thickness of 100 nm formed by a sputtering method is stacked over a silicon oxide film having a thickness of 200 nm formed by a sputtering method is formed. The substrate temperature in deposition may be room temperature to 300° C., inclusive and in this embodiment, is 100° C.

Note that after the insulating film 614 is formed, heat treatment may be performed. Heat treatment is performed under an atmosphere of nitrogen, oxygen, ultra-dry air (air in which a water content is less than or equal to 20 ppm, preferably less than or equal to 1 ppm, more preferably less than or equal to 10 ppb), or a rare gas (argon, helium, or the like) preferably at 200° C. to 400° C., inclusive, for example, 250° C. to 350° C., inclusive. In this embodiment, heat treatment for 1 hour at 250° C. under a nitrogen atmosphere is performed. Alternatively, RTA treatment for a short time at a high temperature may be performed before the formation of the source electrode 608, the drain electrode 609, and the wirings 610 to 613 in a manner similar to that of the heat treatment performed on the oxide semiconductor film. Even when oxygen deficiency occurs in the oxide semiconductor film 605 due to the heat treatment performed on the oxide semiconductor film, the insulating film 614 containing oxygen is provided in contact with an exposed region of the oxide semiconductor film 605 provided between the source electrode 608 and the drain electrode 609, and then heat treatment is performed, whereby oxygen is supplied to the oxide semiconductor film 605. Therefore, when oxygen is supplied to the region of the oxide semiconductor film 605 which is in contact with the insulating film 614, oxygen deficiency serving as a donor can be reduced and the stoichiometric composition ratio can be satisfied. As a result, the oxide semiconductor film 605 can be made to be an i-type semiconductor film or a substantially i-type semiconductor film. Accordingly, electric characteristics of the transistor can be improved and variation in the electric characteristics thereof can be reduced. There is no particular limitation on timing for this heat treatment as long as it is performed after formation of the insulating film 614. The heat treatment also serves as heat treatment in another process, for example, heat treatment in forming a resin film or heat treatment for reducing resistance of a transparent conductive film, whereby the oxide semiconductor film 605 can be made to be an i-type semiconductor film or a substantially i-type semiconductor film without an increase in the number of fabrication steps.

After a conductive film is formed over the insulating film 614, the conductive film is patterned, so that a back gate electrode may be formed in a position where the back gate electrode overlaps with the oxide semiconductor film 605. When the back gate electrode is formed, an insulating film is formed so as to cover the back gate electrode. The back gate electrode can be formed using a material and a structure similar to those of the gate electrode 601, the electrodes 602, the source electrode 608 and the drain electrode 609, or the wirings 610 to 613.

The thickness of the back gate electrode is set to be 10 nm to 400 nm, preferably 100 nm to 200 nm. For example, the back gate electrode may be formed in a such a manner that a conductive film in which a titanium film, an aluminum film, and a titanium film are stacked is formed, a resist mask is formed by a photolithography method or the like, and unnecessary portions are removed by etching so that the conductive film is processed (patterned) to a desired shape.

With the above steps, a second transistor 620 and a capacitor 623 are formed. Note that the capacitor 623 is formed in a region where the source electrode 608 overlaps with still another one of the electrodes 602 with the gate insulating film 603 interposed therebetween. Note that the capacitor 623 is not necessarily formed over the same layer as the second transistor 620, and for example, the capacitor 623 may be formed over the same layer as the first transistor 501 and the third transistor 502.

The second transistor 620 includes the gate electrode 601, the gate insulating film 603 over the gate electrode 601, the oxide semiconductor film 605 which overlaps with the gate electrode 601 over the gate insulating film 603, and a pair of the source electrode 608 and the drain electrode 609 formed over the oxide semiconductor film 605. The second transistor 620 may include the insulating film 614 formed over the oxide semiconductor film 605, as a component. The second transistor 620 illustrated in FIG. 11B has a channel-etched structure in which part of the oxide semiconductor film 605 is exposed between the source electrode 608 and the drain electrode 609.

Although the second transistor 620 is described as a single-gate transistor, a multi-gate transistor including a plurality of channel formation regions can be manufactured when a plurality of the gate electrodes 601 which is electrically connected is included if needed.

Next, as in this embodiment, how characteristics of the transistor are affected by high purification of the oxide semiconductor film by removal of impurities such as moisture, hydrogen, or the like contained in the oxide semiconductor film as much as possible will be described.

Figure 13:
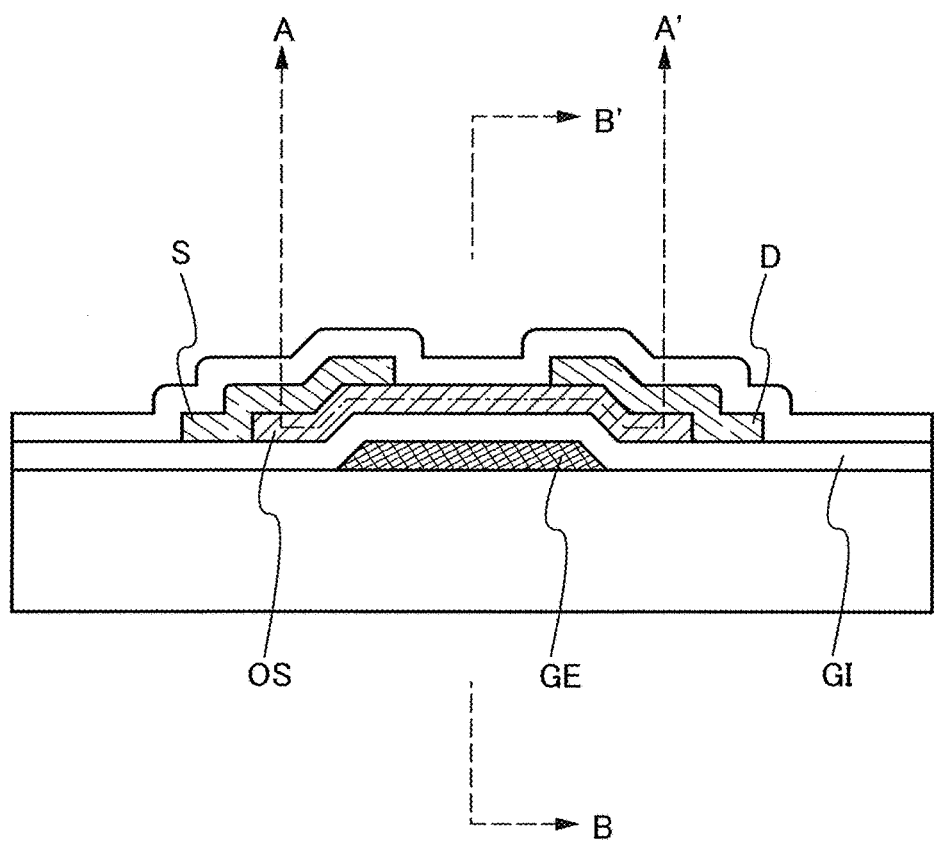
FIG. 13 is a longitudinal cross-sectional view of an inverted staggered transistor which includes an oxide semiconductor.

FIG. 13 is a cross-sectional view of a transistor including an oxide semiconductor. An oxide semiconductor film (OS) is provided over a gate electrode (GE) with a gate insulating film (GI) therebetween; a source electrode (S) and a drain electrode (D) are provided thereover; and an insulating film is provided over the source electrode (S) and the drain electrode (D).

Figure 14:
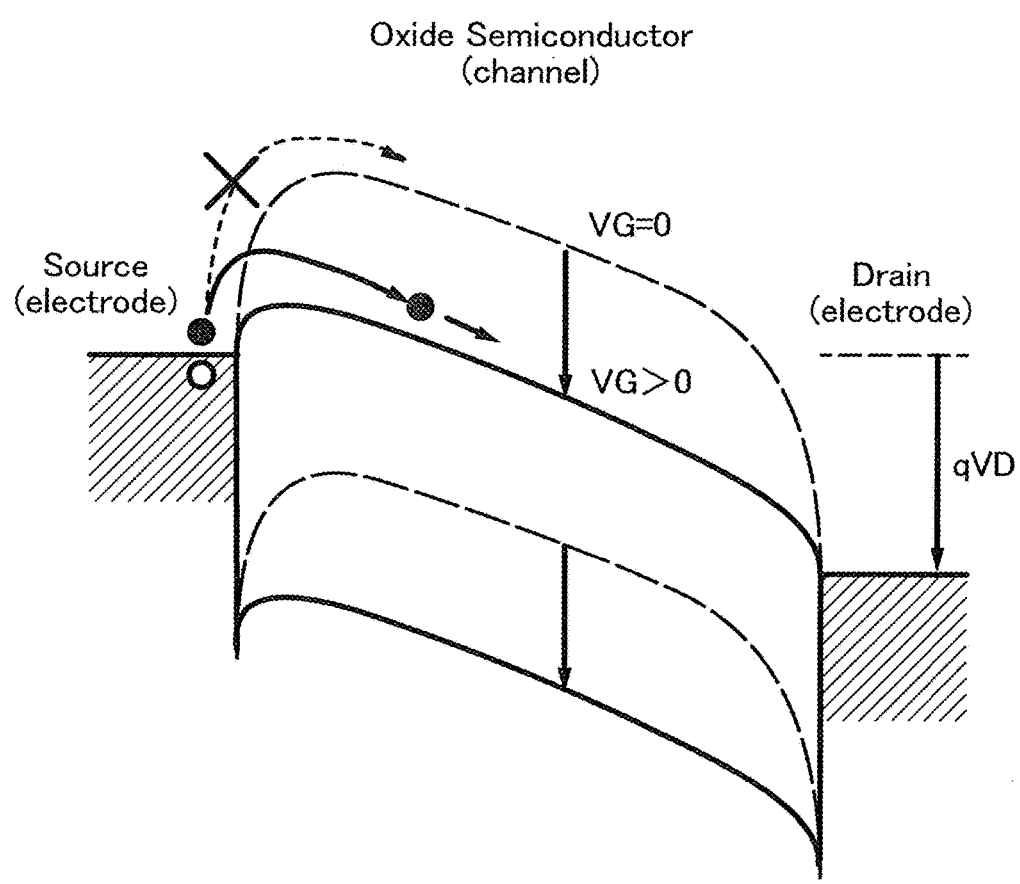
FIG. 14 is an energy band diagram (schematic diagram) of a cross section taken along line A-A' in FIG. 13.

FIG. 14 is an energy band diagram (schematic diagram) of a cross section taken along line A-A' in FIG. 13. In FIG. 14, a black circle (•) represents an electron and has an electric charge −q, whereas a white circle (°) represents a hole and has an electric charge +q. When positive voltage (VD>0) is applied to the drain electrode (D), the case where voltage (VG=0) is not applied to the gate electrode (GE) is indicated by dashed lines and the case where positive voltage (VG>0) is applied to the gate electrode (GE) is indicated by solid lines. In the case where voltage is not applied to the gate electrode (GE), carriers (electrons) are not injected to the oxide semiconductor (OS) film side from the source electrode (S) due to a high potential barrier, showing an off state in which current does not flow. On the other hand, in the case where positive voltage is applied to the gate electrode (GE), the potential barrier is reduced, showing an on state in which current flows to the oxide semiconductor (OS) film.

Figure 15A:
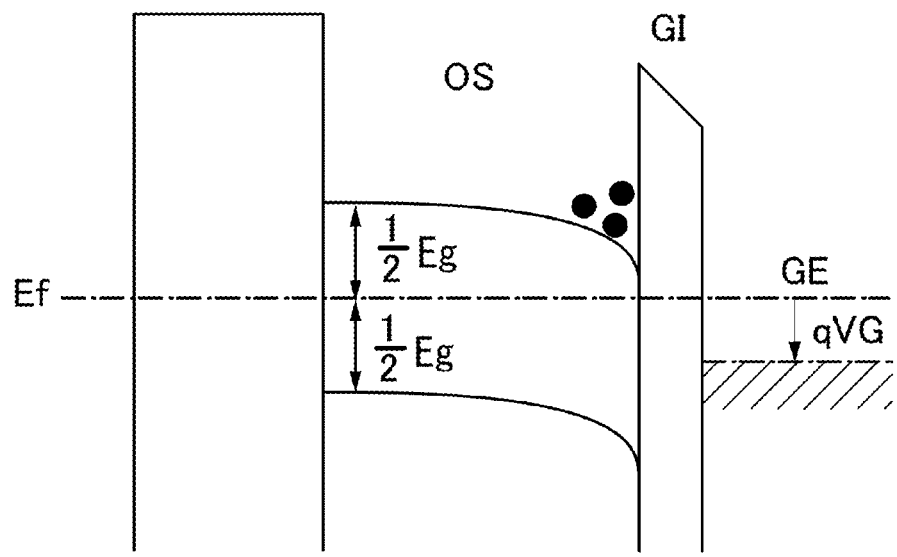
FIG. 15A illustrates an energy band diagram where a positive voltage (VG>0) is applied to a gate electrode (GE)
Figure 15B:
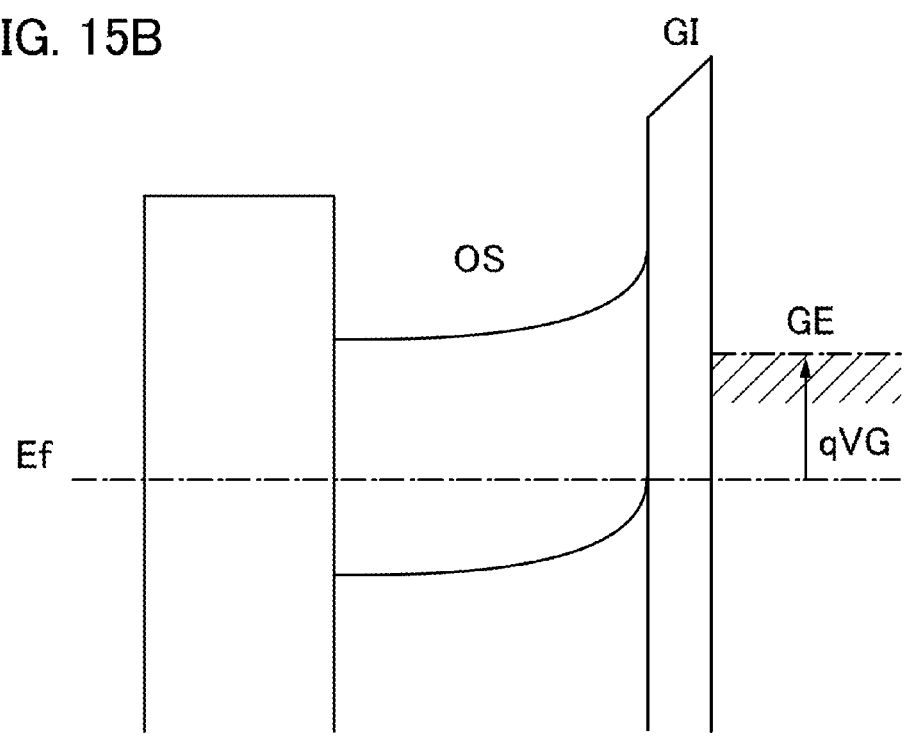
FIG. 15B illustrates an energy band diagram where a negative voltage (VG<0) is applied to the gate electrode (GE).

FIGS. 15A and 15B are energy band diagrams (schematic diagrams) of a cross section taken along line B-B' in FIG. 13. FIG. 15A illustrates the case where positive voltage (VG>0) is applied to a gate electrode (GE) and an on state where carriers (electrons) flow between the source electrode and the drain electrode. FIG. 15B illustrates a state where negative voltage (VG<0) is applied to the gate electrode (GE), in other words, the case where the transistor is in an off-state.

Figure 16:
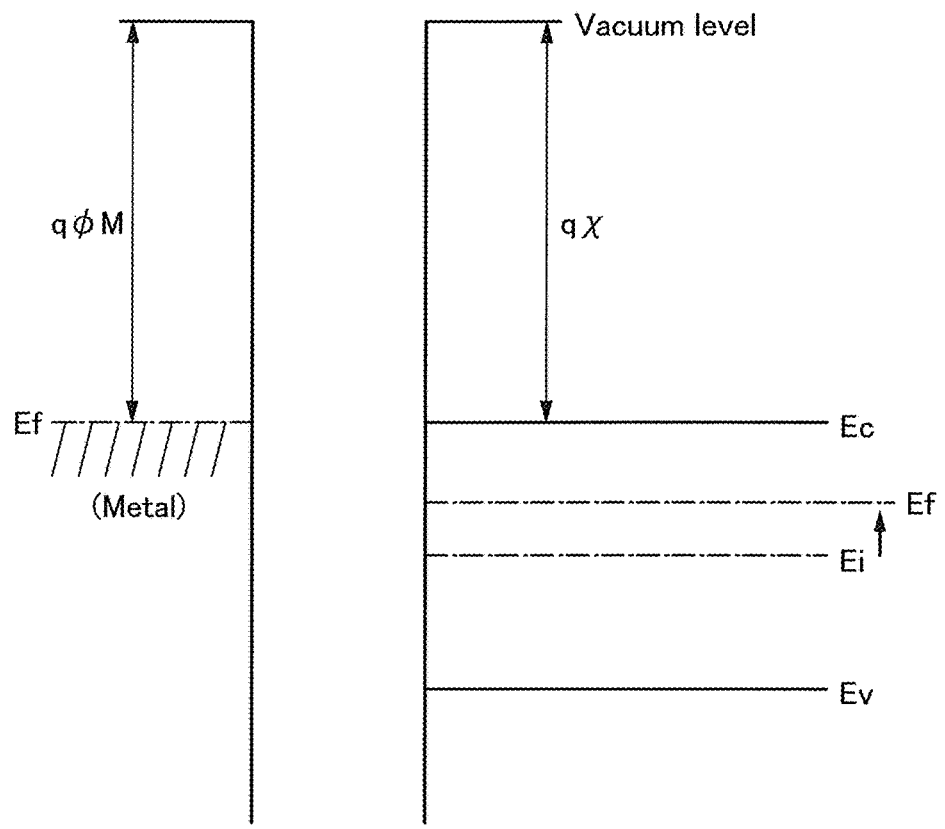
FIG. 16 is a diagram illustrating relationships between a vacuum level, a work function of a metal ($\phi_M$), and electron affinity ($\chi$) of an oxide semiconductor.

FIG. 16 shows the relation between the vacuum level, the work function ($\phi_M$) of metal, and the electron affinity ($\chi$) of the oxide semiconductor.

At normal temperature, electrons in the metal are degenerated and the Fermi level is located in the conduction band.

On the other hand, a conventional oxide semiconductor is an n-type semiconductor, and the Fermi level (Ef) thereof is located nearer to the conduction band (Ec) away from an intrinsic Fermi level (Ei) which is located in the center of the band gap. Note that it is known that part of hydrogen is a donor in the oxide semiconductor and is one factor causing an oxide semiconductor to be an n-type semiconductor. Further, oxygen vacancy is known as one of the causes to produce an n-type oxide semiconductor.

On the other hand, an oxide semiconductor in one embodiment of the present invention is an intrinsic (i-type) or a substantially intrinsic oxide semiconductor which is obtained by removing hydrogen that is an n-type impurity from an oxide semiconductor and purifying the oxide semiconductor such that impurities other than a main component of the oxide semiconductor are prevented from being contained therein as much as possible. That is, the oxide semiconductor becomes an i-type semiconductor not by addition of impurities but by removal of impurities such as moisture or hydrogen and oxygen vacancy as much as possible to have high purity, so that an oxide semiconductor which is an intrinsic (i-type) semiconductor or is a substantially intrinsic (i-type) semiconductor is obtained. With the above structure, the Fermi level (Ef) can be substantially close to the same level as the intrinsic Fermi level (Ei), as indicated by an arrow.

It is said that the band gap (Eg) of an oxide semiconductor is 3.15 eV and the electron affinity ($\chi$) is 4.3 V. The work function of titanium (Ti) used for forming the source and drain electrodes is substantially equal to the electron affinity ($\chi$) of the oxide semiconductor. In that case, a Schottky barrier to electrons is not formed at an interface between the metal and the oxide semiconductor. There are materials satisfying this condition other than titanium.

In that case, as illustrated in FIG. 15A, the electron moves along the lowest part of the oxide semiconductor, which is energetically stable, at an interface between the gate insulating film and the highly-purified oxide semiconductor.

In FIG. 15B, when negative voltage is applied to the gate electrode (GE), holes which are minority carriers are substantially zero; therefore, current is substantially close to zero.

In this manner, the oxide semiconductor film is highly purified so that impurities such as moisture or hydrogen other than a main component of the oxide semiconductor are contained as little as possible, whereby the operation of the transistor can be favorable.

This embodiment can be implemented in combination with any of the above embodiments.

Embodiment 5

In this embodiment, a structure of a programming cell in which a second transistor including an oxide semiconductor film has a structure which is different from that of Embodiment 4 will be described.

Figure 12A:
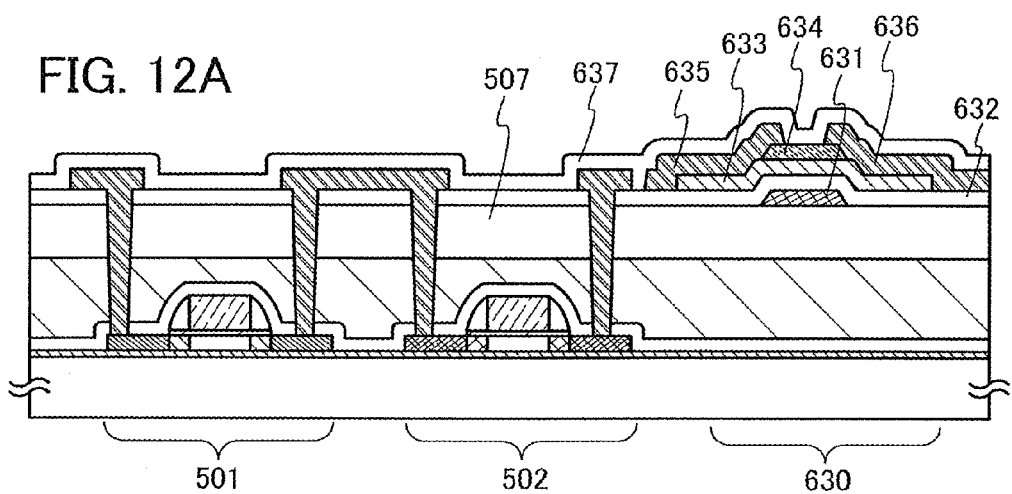
FIGS. 12A to 12C are views illustrating a method for manufacturing a semiconductor device.

A programming cell illustrated in FIG. 12A includes the first transistor 501 and the third transistor 502 similar to that of Embodiment 4. A bottom-gate second transistor 630 which has a channel protective structure and includes an oxide semiconductor film is formed over the first transistor 501 and the third transistor 502 in FIG. 12A.

The second transistor 630 includes a gate electrode 631 provided over the insulating film 507, a gate insulating film 632 provided over the gate electrode 631, an oxide semiconductor film 633 which overlaps with the gate electrode 631 over the gate insulating film 632, a channel protective film 634 which is provided over the oxide semiconductor film 633 to overlap with the gate electrode 631, and a source electrode 635 and a drain electrode 636 which are provided over the oxide semiconductor film 633. The second transistor 630 may include an insulating film 637 provided over the oxide semiconductor film 633, as a component.

The channel protective film 634 can prevent the portion of the oxide semiconductor film 633 serving as a channel formation region from being damaged in a later step (e.g., reduction in thickness due to plasma or an etchant in etching). Therefore, reliability of the transistor can be improved.

The channel protective film 634 can be formed using an inorganic material that contains oxygen (e.g., silicon oxide, silicon nitride oxide, silicon oxynitride, aluminum oxide, or aluminum oxynitride). The channel protective film 634 can be formed by a vapor deposition method such as a plasma enhanced CVD method or a thermal CVD method, or a sputtering method. After the channel protective film 634 is formed, the shape thereof is processed by etching. Here, the channel protective film 634 is formed in such a manner that a silicon oxide film is formed by a sputtering method and processed by etching using a mask formed by photolithography.

An inorganic material containing oxygen is used for the channel protective film 634, whereby a structure can be provided, in which oxygen is supplied to a region of the oxide semiconductor film 633 in contact with at least the channel protective film 634 and oxygen deficiency serving as a donor is reduced to satisfy the stoichiometric composition ratio even when the oxygen deficiency occurs in the oxide semiconductor film 633 by heat treatment for reducing moisture or hydrogen. Accordingly, the channel formation region can be made to be an i-type channel formation region or a substantially i-type channel formation region, variation in electric characteristics of a transistor due to oxygen deficiency can be reduced, and electric characteristics can be improved.

Note that the second transistor 630 may further include a back gate electrode over the insulating film 637. The back gate electrode may be formed so as to overlap with a channel formation region in the oxide semiconductor film 633. The back gate electrode may be electrically insulated to be in a floating state, or may be in a state where the back gate electrode is supplied with a potential. In the case of the latter, the back gate electrode may be supplied with the same potential as the gate electrode 631, or may be supplied with a fixed potential such as a ground potential. The level of the potential supplied to the back gate electrode may be controlled so as to control the threshold voltage of the second transistor 630.

Figure 12B:
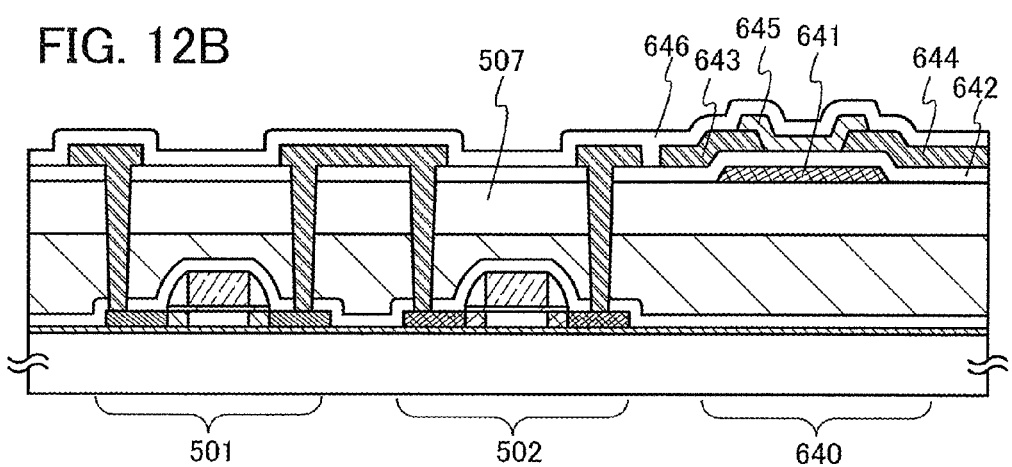

A programming cell illustrated in FIG. 12B includes the first transistor 501 using crystalline silicon and the third transistor 502 using crystalline silicon in a manner similar to that of Embodiment 4. A bottom-contact second transistor 640 which includes an oxide semiconductor film is formed over the first transistor 501 and the third transistor 502 in FIG. 12B.

The second transistor 640 includes a gate electrode 641 formed over the insulating film 507, a gate insulating film 642 over the gate electrode 641, a source electrode 643 and a drain electrode 644 which are over the gate insulating film 642, and an oxide semiconductor film 645 which overlaps with the gate electrode 641. The second transistor 640 may include an insulating film 646 provided over the oxide semiconductor film 645, as a component.

The thickness of each of the source electrode 643 and the drain electrode 644 of the bottom-contact second transistor 640 in FIG. 12B is preferably smaller than that of the bottom-gate transistor described in Embodiment 4 in order to prevent disconnection of the oxide semiconductor film 645 formed later. Specifically, the thickness of each of the source electrode 643 and the drain electrode 644 is 10 nm to 200 nm, preferably 50 nm to 75 nm.

Note that the second transistor 640 may further include a back gate electrode over the insulating film 646. The back gate electrode may be formed so as to overlap with a channel formation region in the oxide semiconductor film 645. The back gate electrode may be electrically insulated to be in a floating state, or may be in a state where the back gate electrode is supplied with a potential. In the case of the latter, the back gate electrode may be supplied with the same potential as the gate electrode 641, or may be supplied with a fixed potential such as a ground potential. The level of the potential supplied to the back gate electrode may be controlled so as to control the threshold voltage of the second transistor 640.

Figure 12C:
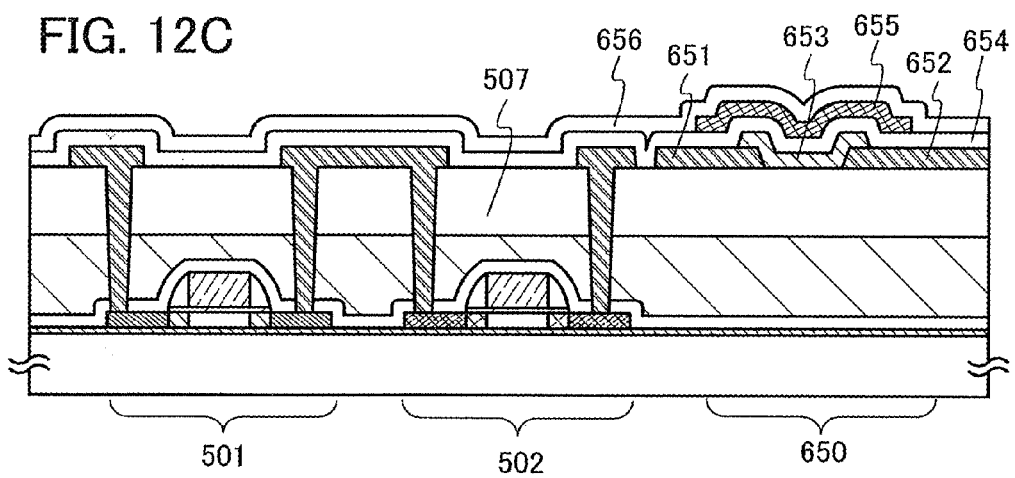

A programming cell illustrated in FIG. 12C includes the first transistor 501 and the third transistor 502 which are formed using crystalline silicon in a manner similar to that of Embodiment 4. A top-gate second transistor 650 which includes an oxide semiconductor film is formed over the first transistor 501 and the third transistor 502 in FIG. 12C.

The second transistor 650 includes a source electrode 651 and a drain electrode 652 which are formed over the insulating film 507, an oxide semiconductor film 653 formed over the source electrode 651 and the drain electrode 652, a gate insulating film 654 over the oxide semiconductor film 653, and a gate electrode 655 which overlaps with the oxide semiconductor film 653 over the gate insulating film 654. In addition, the second transistor 650 may include an insulating film 656 provided over the gate electrode 655, as a component.

The thickness of each of the source electrode 651 and the drain electrode 652 of the top-gate second transistor 650 in FIG. 12C is preferably smaller than that of the bottom-gate transistor described in Embodiment 4 in order to prevent disconnection of the oxide semiconductor film 653 formed later. Specifically, the thickness of each of the source electrode 651 and the drain electrode 652 is 10 nm to 200 nm, preferably 50 nm to 75 nm.

This embodiment can be implemented in combination with any of the above embodiments.

Example 1

A semiconductor device according to one embodiment of the present invention is used, so that a highly reliable electronic device and an electronic device with low power consumption can be provided. In particular, in the case where a portable electronic device which has difficulty in continuously receiving electric power is used, a semiconductor device with low power consumption according to one embodiment of the present invention is added to the component of the device, whereby an advantage in increasing the continuous duty period can be obtained. Further, by use of a transistor with low off-state current, redundant circuit design which is needed to cover a failure caused by high off-state current is unnecessary; therefore, the density of an integrated circuit used for the semiconductor device can be increased, and a higher performance semiconductor device can be formed.

The semiconductor device according to one embodiment of the present invention can be used for display devices, laptops, or image reproducing devices provided with recording media (typically, devices which reproduce the content of recording media and have displays for displaying the reproduced images such as digital versatile discs (DVDs)). Other than the above, as an electronic appliance which can use the semiconductor device according to one embodiment of the present invention, mobile phones, game machines including portable game machines, portable information terminals, e-book readers, video cameras, digital still cameras, goggle-type displays (head mounted displays), navigation systems, audio reproducing devices (e.g., car audio systems and digital audio players), copiers, facsimiles, printers, multi-function printers, automated teller machines (ATM), vending machines, and the like can be given. Specific examples of these electronic devices are illustrated in FIGS. 17A to 17D.

Figure 17A:
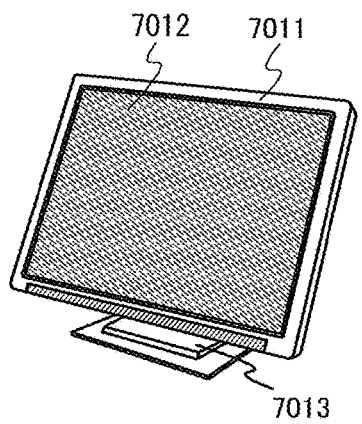
FIGS. 17A to 17D are views each illustrating a structure of an electronic device.

FIG. 17A illustrates a display device including a housing 7011, a display portion 7012, a supporting base 7013, and the like. The semiconductor device according to one embodiment of the present invention can be used for an integrated circuit for controlling driving of the display device, so that a highly reliable display device and a display device with low power consumption can be provided. Note that a display device includes all display devices for displaying information, such as display devices for personal computers, for receiving television broadcast, and for displaying advertisement, in its category.

Figure 17B:
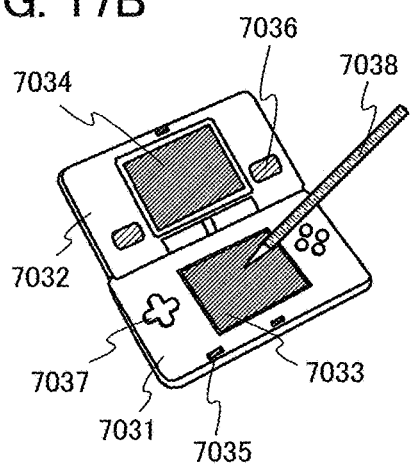

FIG. 17B illustrates a portable game machine including a housing 7031, a housing 7032, a display portion 7033, a display portion 7034, a microphone 7035, speakers 7036, an operation key 7037, a stylus 7038, and the like. The semiconductor device according to one embodiment of the present invention can also be used for an integrated circuit for controlling the driving of the portable game machine, so that a highly reliable portable game machine and a portable game machine with low power consumption can be provided. Although the portable game machine illustrated in FIG. 17B includes two display portions 7033 and 7034, the number of display portions included in the portable game machine is not limited to two.

Figure 17C:
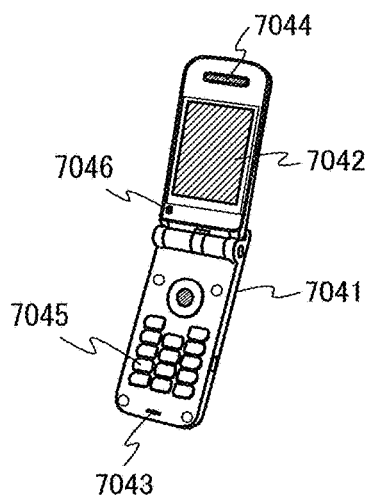

FIG. 17C illustrates a mobile phone including a housing 7041, a display portion 7042, an audio-input portion 7043, an audio-output portion 7044, operation keys 7045, a light-receiving portion 7046, and the like. Light received in the light-receiving portion 7046 is converted into electrical signals, whereby external images can be loaded. The semiconductor device according to one embodiment of the present invention can also be used for an integrated circuit for controlling the driving of the mobile phone, so that a highly reliable mobile phone and a mobile phone with low power consumption can be provided.

Figure 17D:
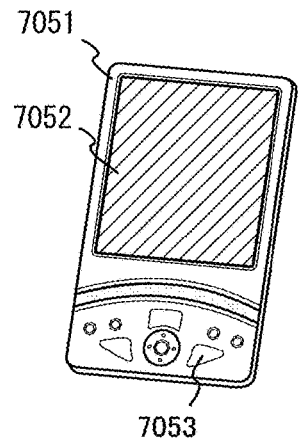

FIG. 17D is a portable information terminal including a housing 7051, a display portion 7052, an operation key 7053, and the like. In the portable information terminal illustrated in FIG. 17D, a modem may be incorporated in the housing 7051. The semiconductor device according to one embodiment of the present invention can also be used for an integrated circuit for controlling the driving of the portable information terminal, so that a highly reliable portable information terminal and a portable information terminal with low power consumption can be provided.

This example can be implemented by being combined as appropriate with any of the above embodiments.

This application is based on Japanese Patent Application serial no. 2010-009569 filed with Japan Patent Office on Jan. 20, 2010, the entire contents of which are hereby incorporated by reference.

The invention claimed is:

1. A semiconductor device comprising:
a first node;
a second node;
a third node;
a first transistor;
a second transistor; and
a third transistor,
wherein the third node is configured to be supplied with a fixed potential,
wherein the first transistor is configured to work as a switching element to control connection between the first node and the second node,
wherein the second transistor is configured to control supply of a data potential from a data signal line to a gate electrode of the first transistor,
wherein the third transistor is configured to work as a switching element to control connection between the second node and the third node, and
wherein the gate electrode of the first transistor is in a floating state when the second transistor is in an off-state.

2. The semiconductor device according to claim 1, wherein the second transistor is configured to control supply of the data potential from the data signal line to a gate electrode of the third transistor.

3. The semiconductor device according to claim 1, wherein the first transistor and the second transistor are n-type, and the third transistor is p-type.

4. The semiconductor device according to claim 1, wherein the third node is grounded.

5. The semiconductor device according to claim 1, wherein the semiconductor device is configured to supply the fixed potential to the second node when the first transistor is in an off-state.

6. The semiconductor device according to claim 1, wherein the second transistor comprises a channel formation region comprising an oxide semiconductor.

7. The semiconductor device according to claim 1, further comprising a capacitor between the gate electrode of the first transistor and the third node.

8. The semiconductor device according to claim 1,
wherein the first transistor comprises a channel formation region comprising silicon,
wherein the second transistor comprises a channel formation region comprising an oxide semiconductor, and
wherein the second transistor is positioned over the first transistor with an insulating film therebetween.

9. A semiconductor device comprising:
a first node;
a second node;
a third node;
a first transistor;
a second transistor; and
a resistor,
wherein the third node is configured to be supplied with a fixed potential,
wherein the first transistor is configured to work as a switching element to control connection between the first node and the second node,
wherein the second transistor is configured to control supply of a data potential from a data signal line to a gate electrode of the first transistor,
wherein the resistor is provided between the second node and the third node, and
wherein the gate electrode of the first transistor is in a floating state when the second transistor is in an off-state.

10. The semiconductor device according to claim 9, wherein the first transistor and the second transistor are n-type.

11. The semiconductor device according to claim 9, wherein the third node is grounded.

12. The semiconductor device according to claim 9, wherein the semiconductor device is configured to supply the fixed potential to the second node when the first transistor is in an off-state.

13. The semiconductor device according to claim 9, wherein the second transistor comprises a channel formation region comprising an oxide semiconductor.

14. The semiconductor device according to claim 9, further comprising a capacitor between the gate electrode of the first transistor and the third node.

15. The semiconductor device according to claim 9,
wherein the first transistor comprises a channel formation region comprising silicon,
wherein the second transistor comprises a channel formation region comprising an oxide semiconductor, and
wherein the second transistor is positioned over the first transistor with an insulating film therebetween.

16. A semiconductor device comprising:
a first node;
a second node;
a third node;
a first transistor;
a second transistor; and
a third transistor,
wherein the first transistor is configured to work as a switching element to control connection between the first node and the second node,
wherein the second transistor is configured to control supply of a data potential from a data signal line to a gate electrode of the first transistor,
wherein the third transistor is configured to work as a switching element to control connection between the second node and the third node, and
wherein the gate electrode of the first transistor is in a floating state when the second transistor is in an off-state.

17. The semiconductor device according to claim 16, wherein the second transistor is configured to control supply of the data potential from the data signal line to a gate electrode of the third transistor.

18. The semiconductor device according to claim 16, wherein the first transistor and the second transistor are n-type, and the third transistor is p-type.

19. The semiconductor device according to claim 16, wherein the semiconductor device is configured to supply a fixed potential to the second node when the first transistor is in an off-state.

20. The semiconductor device according to claim 16,
wherein the first transistor comprises a channel formation region comprising silicon,
wherein the second transistor comprises a channel formation region comprising an oxide semiconductor, and
wherein the second transistor is positioned over the first transistor with an insulating film therebetween.

* * * * *